United States Patent
Yamazaki

(10) Patent No.: US 8,030,745 B2
(45) Date of Patent: Oct. 4, 2011

(54) ID CHIP AND IC CARD

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 37 days.

(21) Appl. No.: 10/590,271

(22) PCT Filed: Feb. 28, 2005

(86) PCT No.: PCT/JP2005/003804
§ 371 (c)(1),
(2), (4) Date: Aug. 22, 2006

(87) PCT Pub. No.: WO2005/086088
PCT Pub. Date: Sep. 15, 2005

(65) Prior Publication Data
US 2007/0176622 A1    Aug. 2, 2007

(30) Foreign Application Priority Data
Mar. 4, 2004   (JP) .................................. 2004-060103

(51) Int. Cl.
*H01L 23/02*   (2006.01)
(52) U.S. Cl. ............... 257/679; 257/53; 257/64; 257/83; 257/84; 257/E23.064; 257/E23.176; 257/923
(58) Field of Classification Search ........... 343/700 MS; 235/380, 492; 257/53, 64, 83, 84, 679, E23.064, 257/E23.176, 923
See application file for complete search history.

(56) References Cited

U.S. PATENT DOCUMENTS

| | | | | |
|---|---|---|---|---|
| 4,575,621 | A | * | 3/1986 | Dreifus .......................... 235/380 |
| 4,695,859 | A | * | 9/1987 | Guha et al. ...................... 257/64 |
| 4,829,166 | A | | 5/1989 | Froelich |
| 5,789,733 | A | * | 8/1998 | Jachimowicz et al. ....... 235/492 |

(Continued)

FOREIGN PATENT DOCUMENTS

CN   1169036   12/1997

(Continued)

OTHER PUBLICATIONS

International Search Report (Application No. PCT/JP2005/003804) dated Jun. 14, 2005.

(Continued)

*Primary Examiner* — Wai Sing Louie
*Assistant Examiner* — Bilkis Jahan
(74) *Attorney, Agent, or Firm* — Eric J. Robinson; Robinson Intellectual Property Law Office, P.C.

(57) ABSTRACT

The present invention provides an ID chip or an IC card in which the mechanical strength of an integrated circuit can be enhanced without suppressing a circuit scale. An ID chip or an IC card of the present invention has an integrated circuit in which a TFT (a thin film transistor) is formed from an insulated thin semiconductor film. Further, an ID chip or an IC card of the present invention has a light-emitting element and a light-receiving element each using a non-single-crystal thin film for a layer conducting photoelectric conversion. Such a light-emitting element or a light-receiving element may be formed consecutively to (integrally with) an integrated circuit or may be formed separately and attached to an integrated circuit.

16 Claims, 20 Drawing Sheets

U.S. PATENT DOCUMENTS

| | | | |
|---|---|---|---|
| 5,990,496 A | 11/1999 | Kunisato et al. | |
| 6,040,520 A | 3/2000 | Morooka et al. | |
| 6,162,656 A | 12/2000 | Kunisato et al. | |
| 6,590,633 B1 * | 7/2003 | Nishi et al. | 355/53 |
| 6,838,773 B2 | 1/2005 | Kikuchi et al. | |
| 7,029,950 B2 | 4/2006 | Yonehara et al. | |
| 2002/0100941 A1 | 8/2002 | Yonehara et al. | |
| 2002/0149119 A1 * | 10/2002 | Kumatani | 257/784 |
| 2003/0032213 A1 * | 2/2003 | Yonezawa et al. | 438/48 |
| 2003/0052324 A1 * | 3/2003 | Kimura | 257/83 |
| 2003/0116790 A1 | 6/2003 | Kikuchi et al. | |
| 2004/0152392 A1 * | 8/2004 | Nakamura | 445/25 |
| 2005/0202595 A1 | 9/2005 | Yonehara et al. | |

FOREIGN PATENT DOCUMENTS

| | | |
|---|---|---|
| CN | 1204159 | 1/1999 |
| EP | 0 803 916 | 10/1997 |
| EP | 1 229 582 | 8/2002 |
| EP | 1 453 112 | 9/2004 |
| JP | 01-502140 | 7/1989 |
| JP | 04-025497 | 1/1992 |
| JP | 11-020360 | 1/1999 |
| JP | 2001-155134 | 6/2001 |
| JP | 2001-257292 | 9/2001 |
| JP | 2002-083894 | 3/2002 |
| JP | 2002-231909 | 8/2002 |
| WO | WO 88/04453 | 6/1988 |
| WO | WO 89/01671 | 2/1989 |

OTHER PUBLICATIONS

Written Opinion (Application No. PCT/JP2005/003804) dated Jun. 14, 2005.

Office Action (Application Serial No. 200580006883.6) dated Apr. 4, 2008.

* cited by examiner

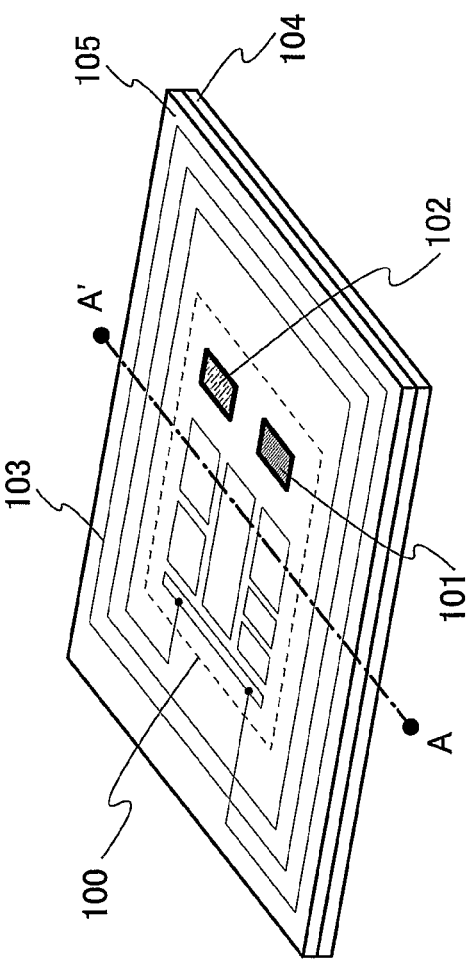
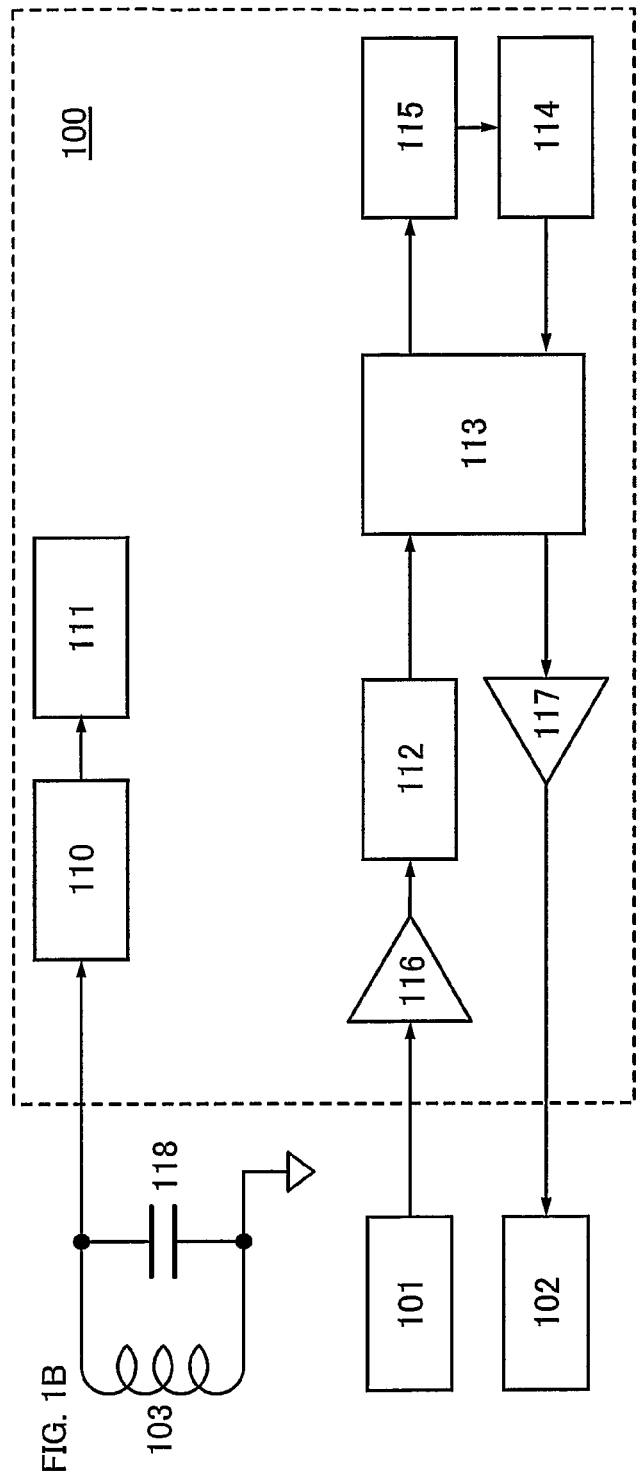
FIG. 1A
FIG. 1B

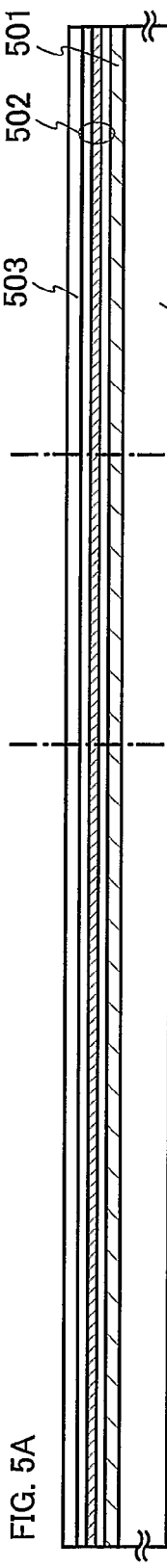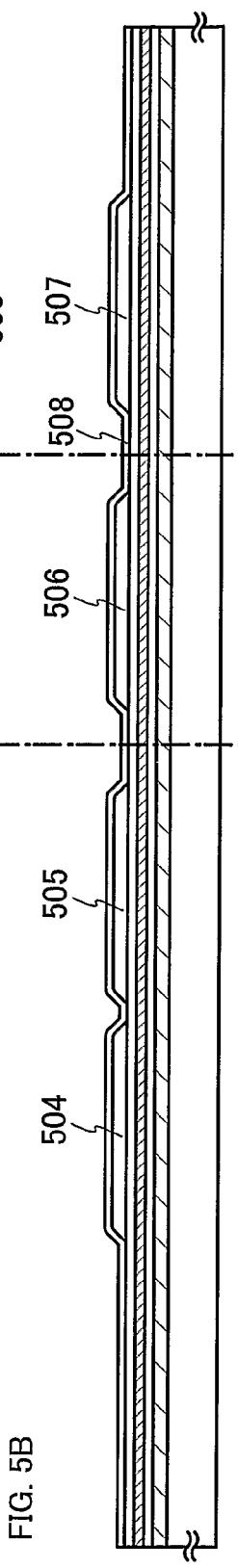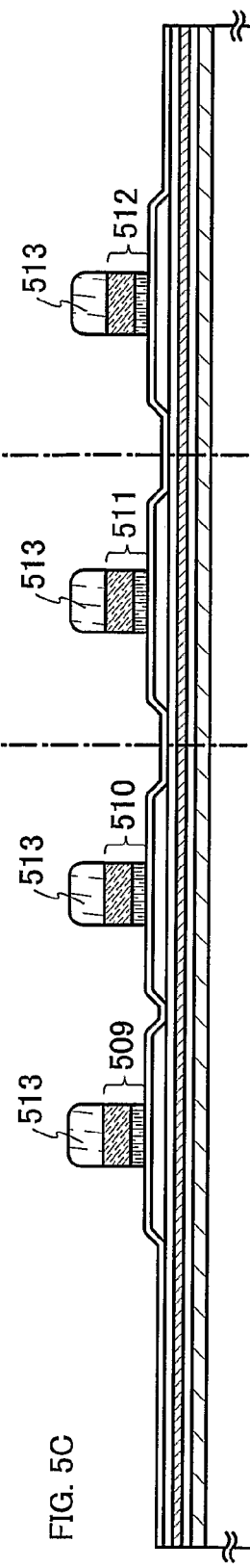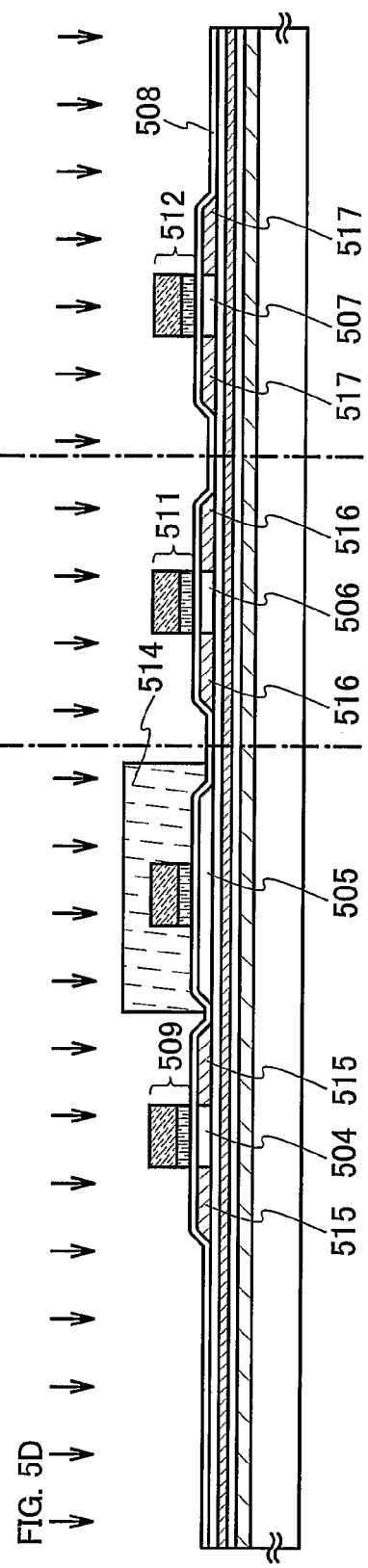

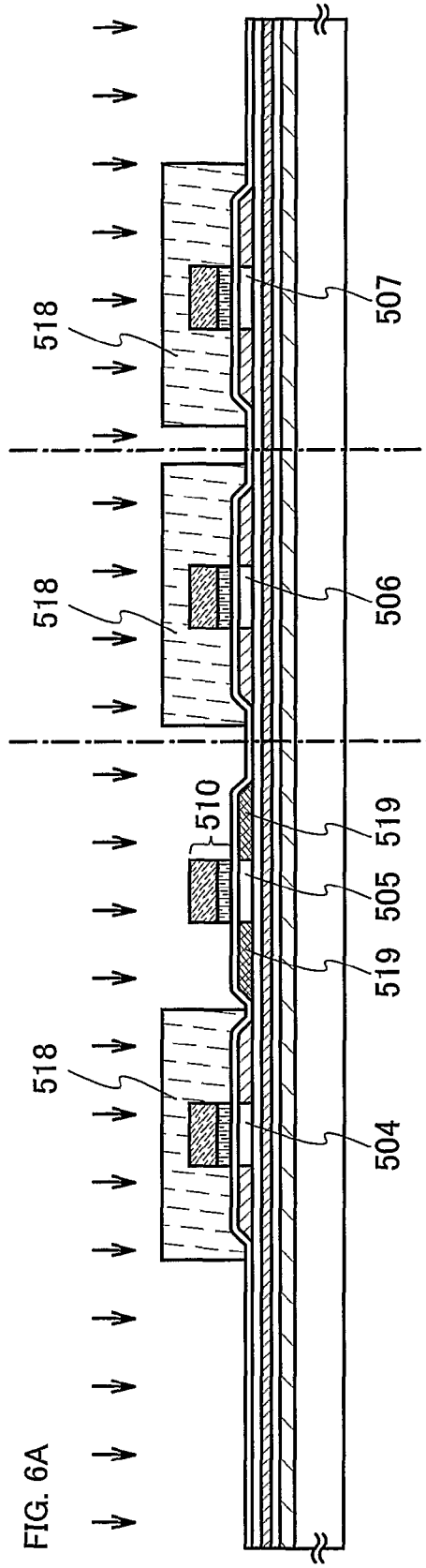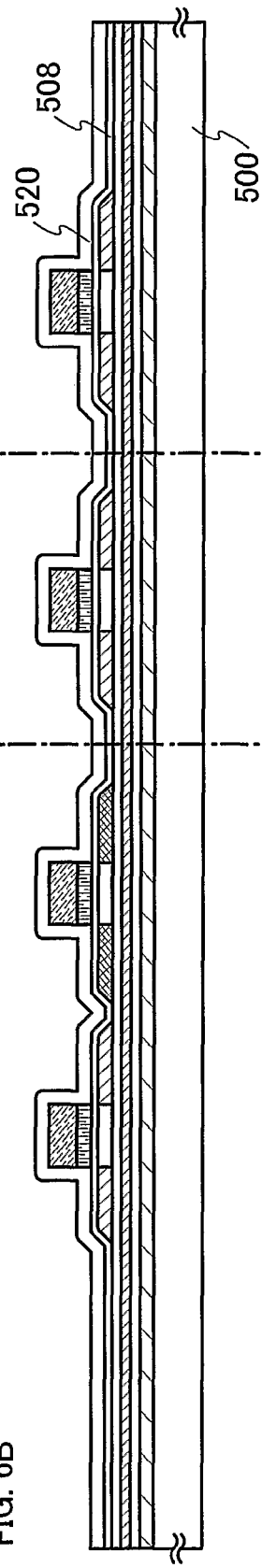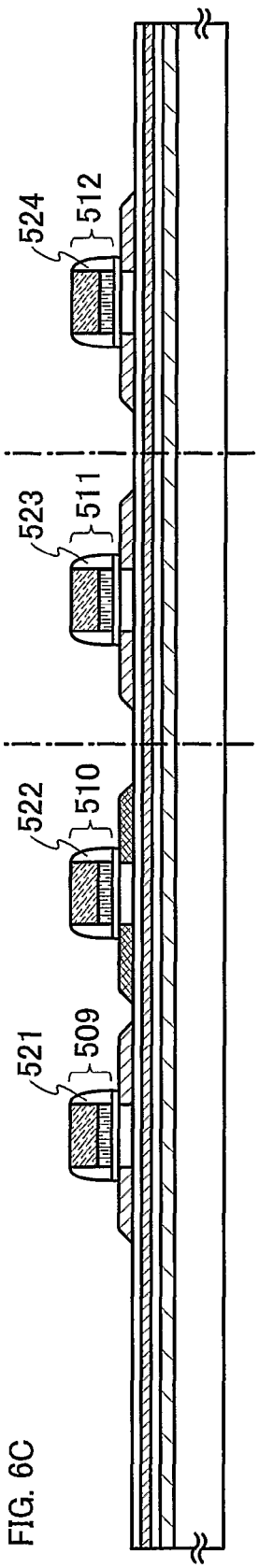

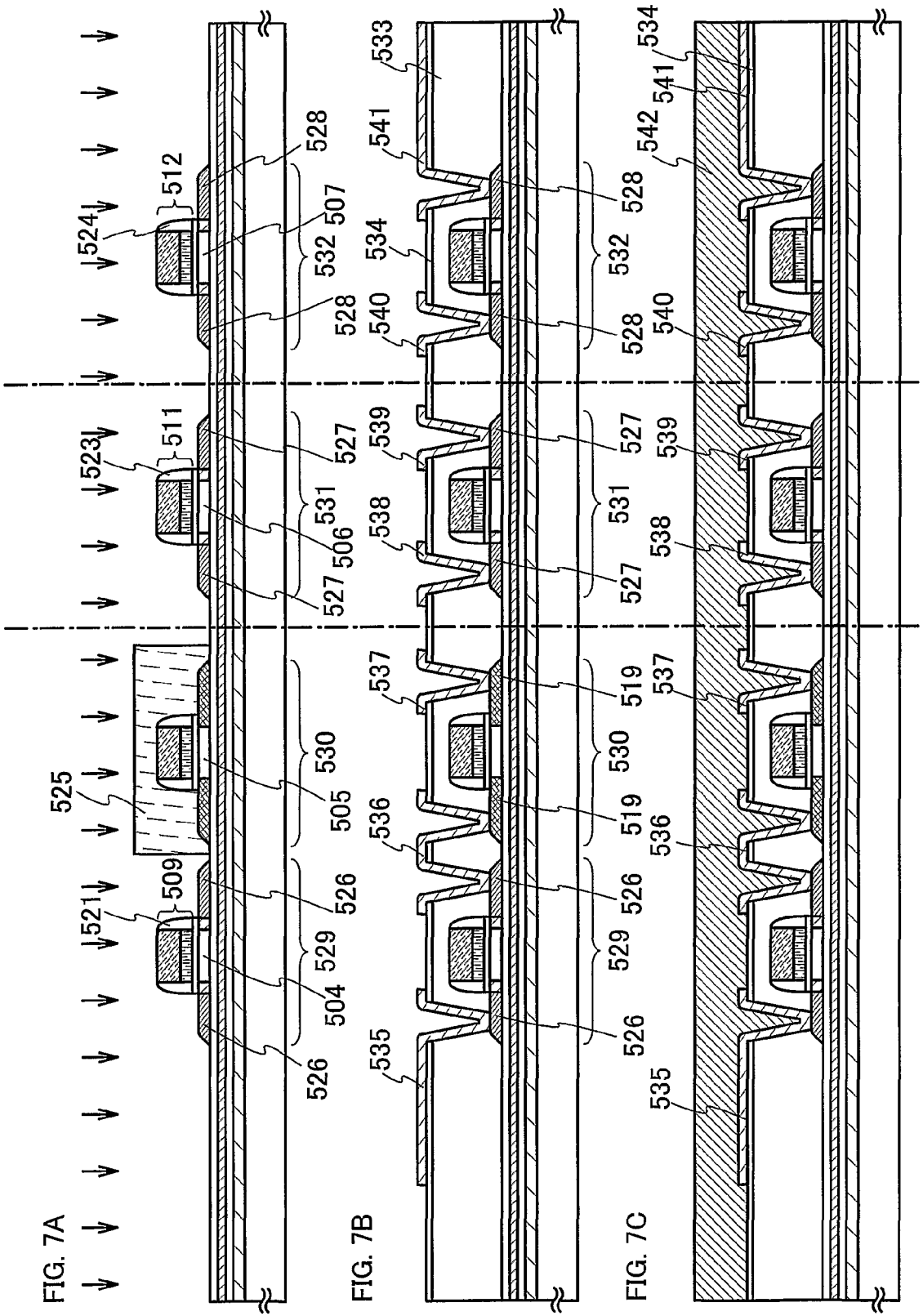

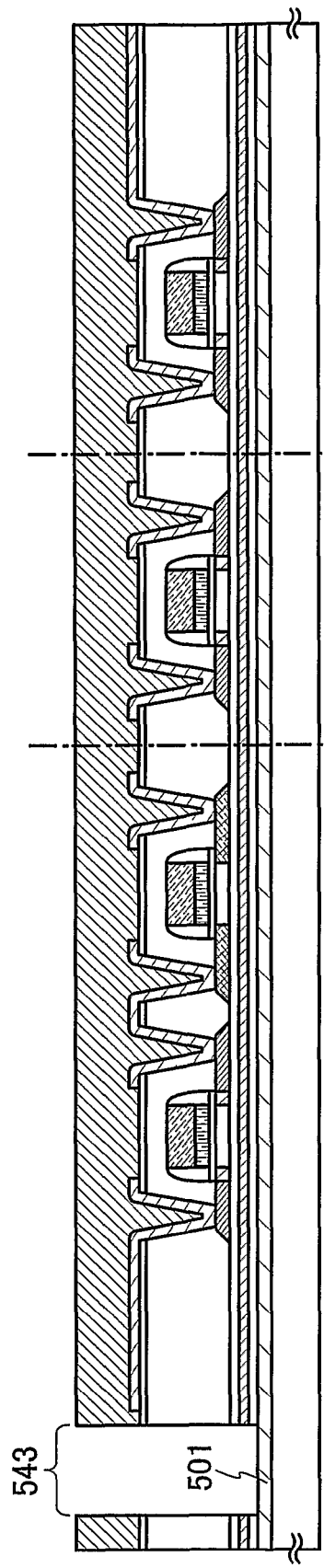
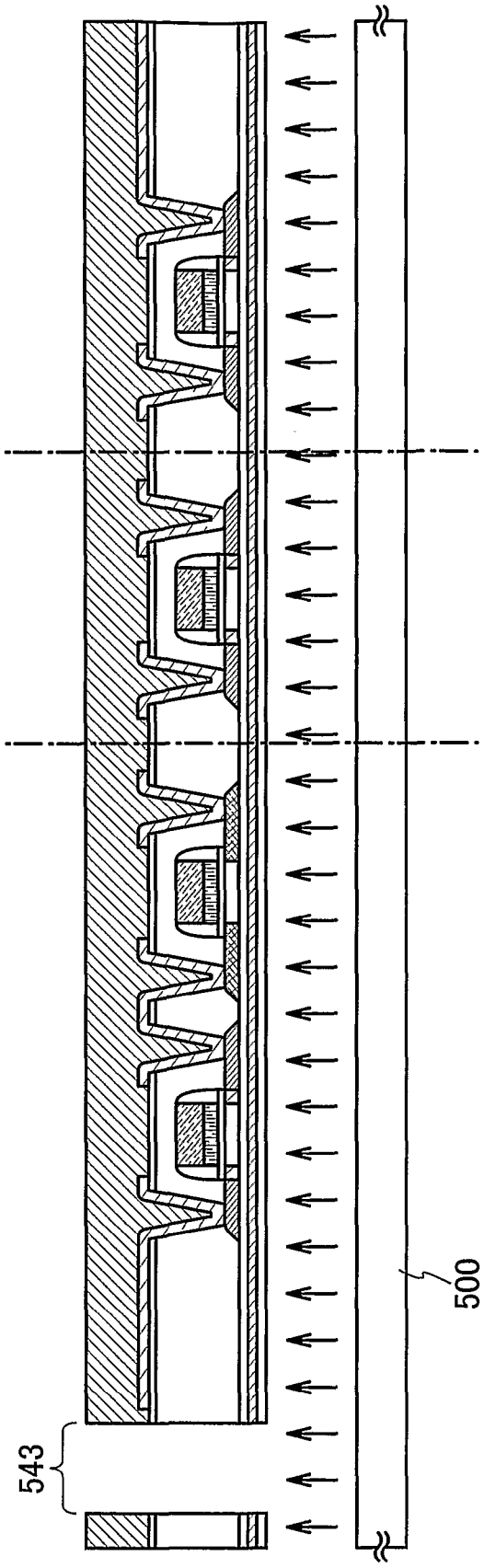
FIG. 8A  543, 501
FIG. 8B  543, 500

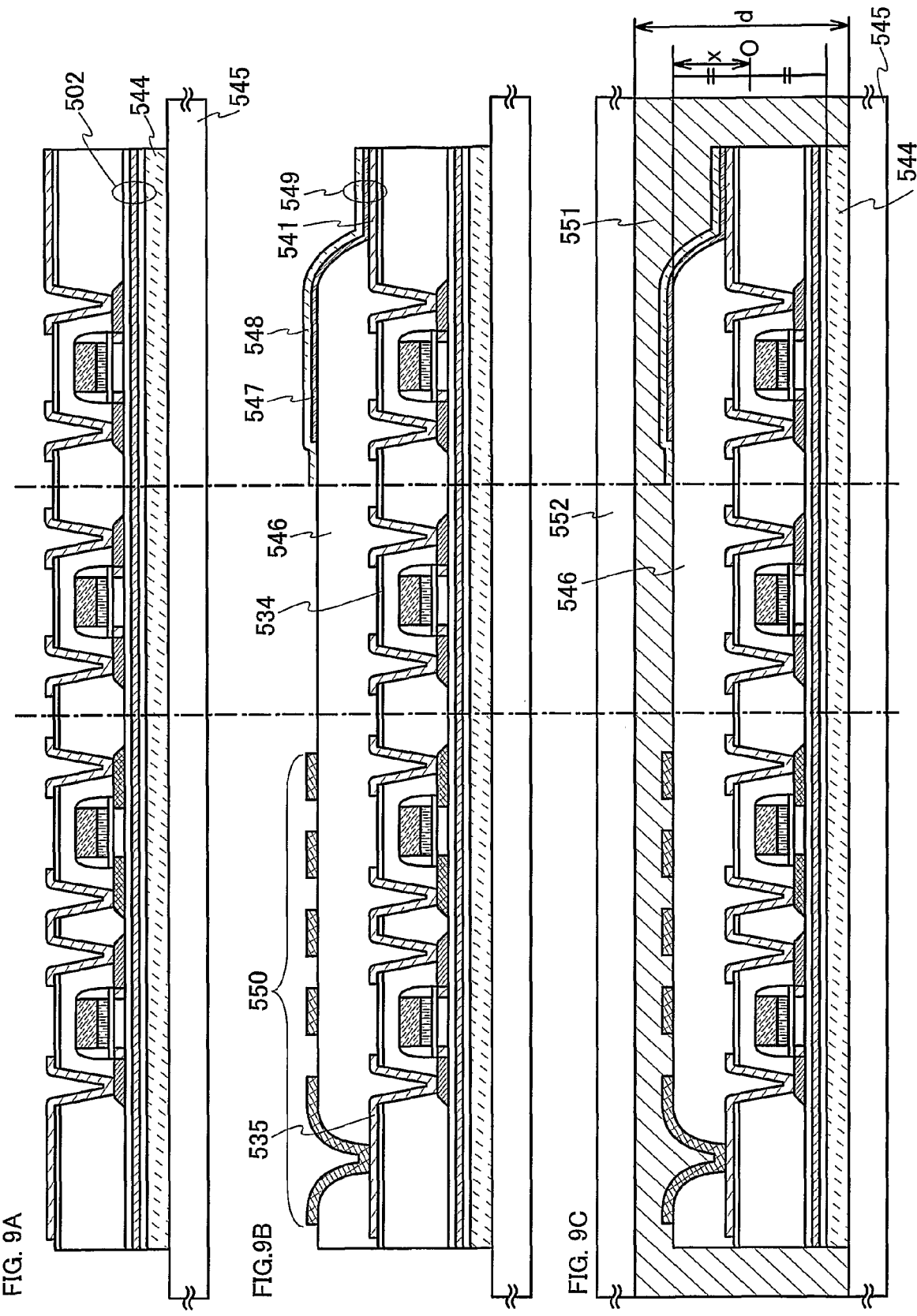

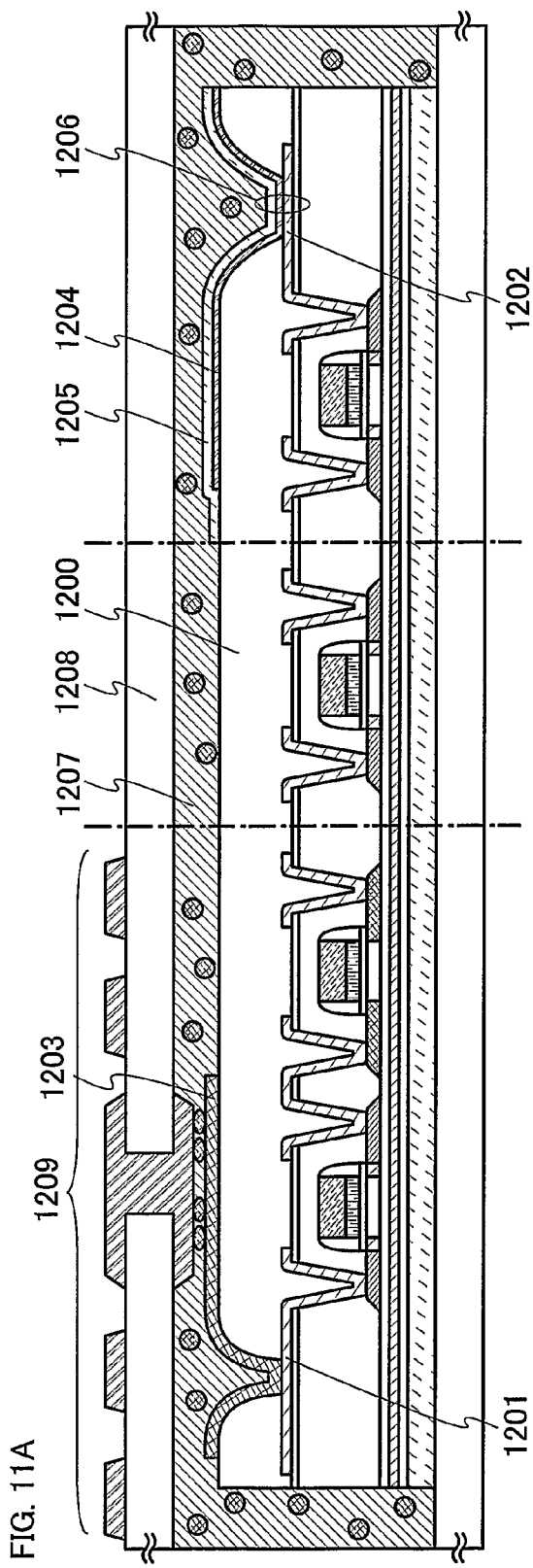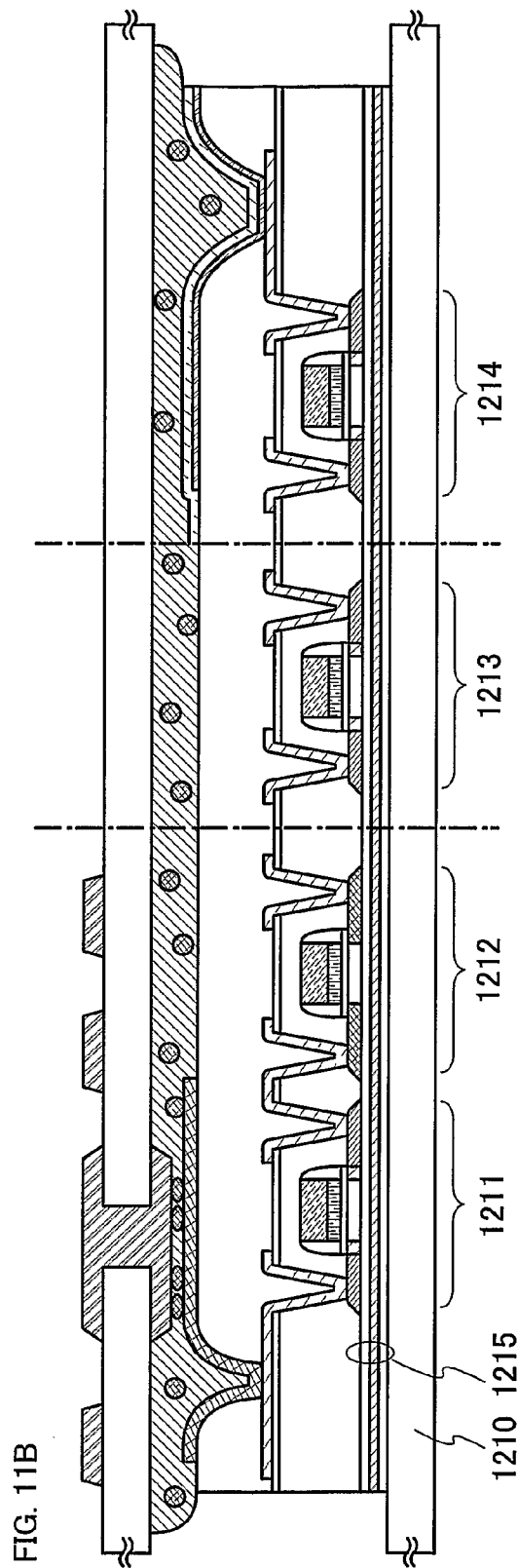
FIG. 11A
FIG. 11B

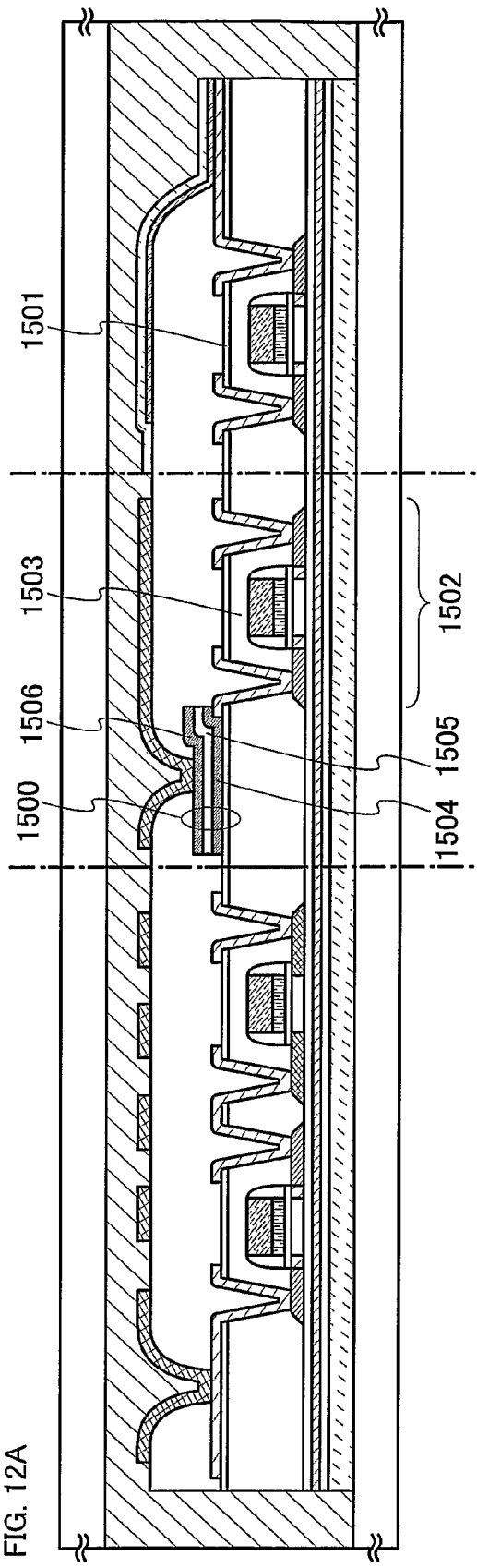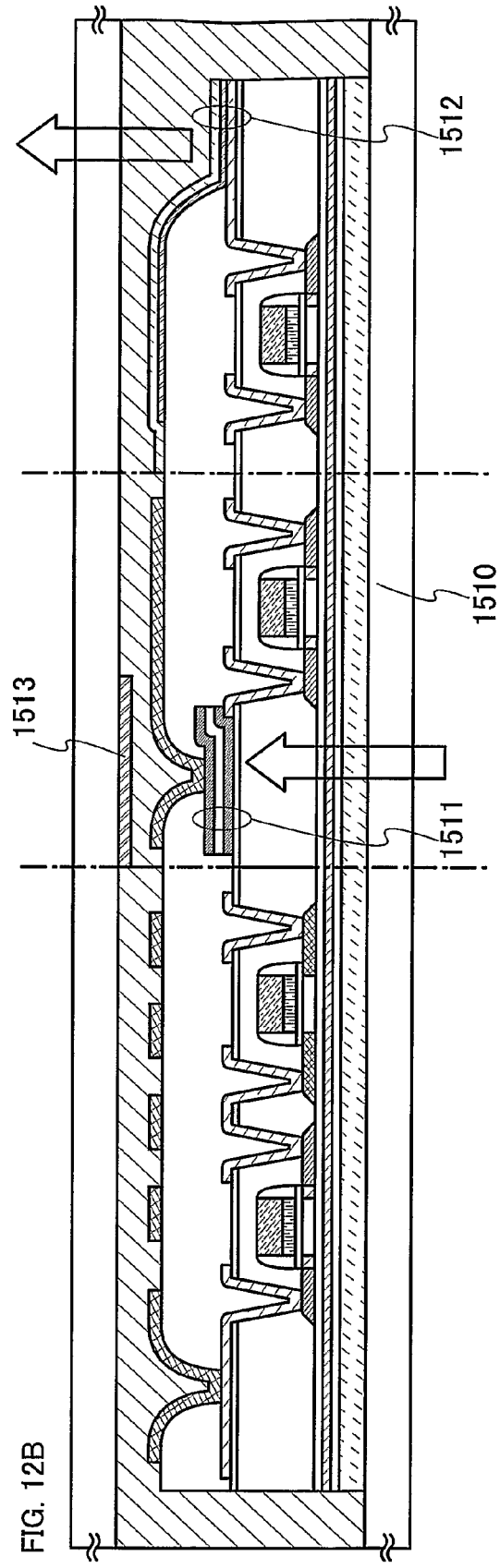

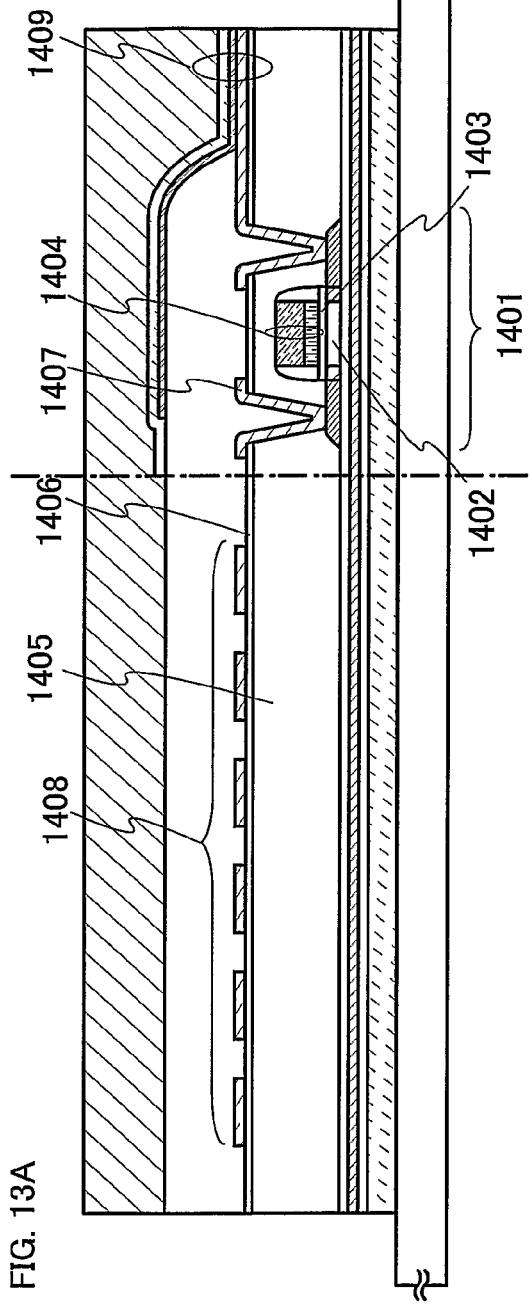
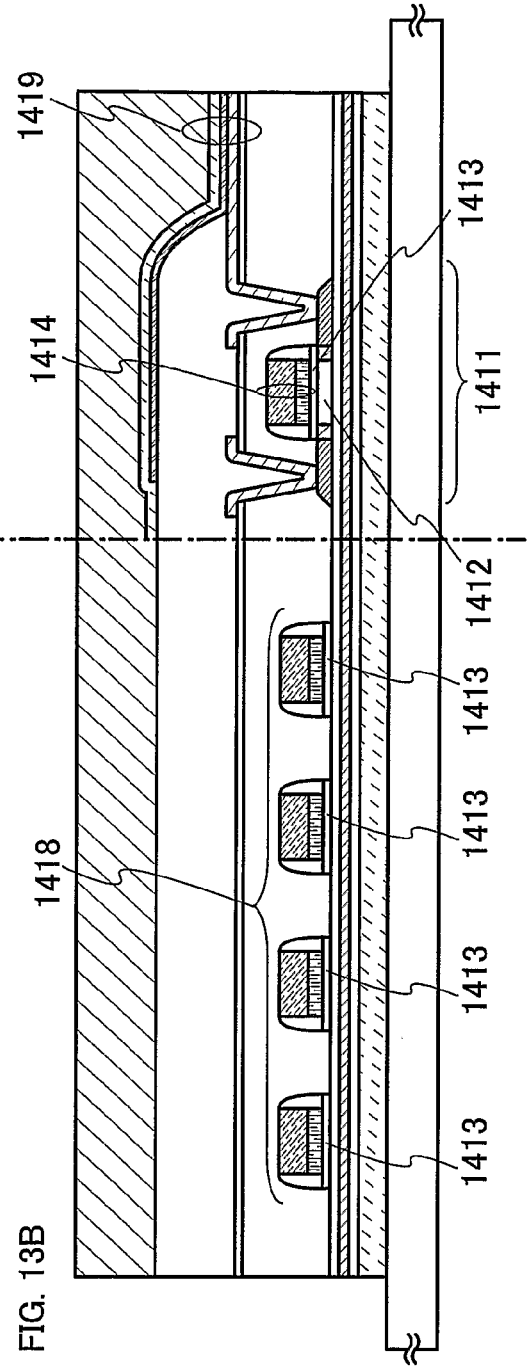

ID CHIP AND IC CARD

TECHNICAL FIELD

The present invention relates to an ID chip or an IC card using an optical communication.

BACKGROUND ART

An ID chip or an IC card that can transmit and receive data such as identification information wirelessly has been put into practice in various areas, and the expansion of its market is further anticipated as a communication information terminal of a new mode. An ID chip is also called a wireless tag, a RFID (Radio frequency identification) tag or an IC tag. In general, an ID chip or an IC card having an antenna and an integrated circuit (IC chip) formed by using a semiconductor substrate is put to practical use at present.

DISCLOSURE OF INVENTION

A semiconductor substrate which is employed to form an integrated circuit is poor in flexibility, and its mechanical strength is low. The mechanical strength can be improved to some extent by reducing the area of an integrated circuit itself. In this case, however, securing a circuit scale is difficult and the application of an ID chip or an IC card is limited, which is not favorable. Therefore, it is not preferable that the area of an integrated circuit is randomly reduced when securing the circuit scale of the integrated circuit is considered to be important, and thus the enhancement of the mechanical strength is limited.

The present invention has been made in view of the above described problems. It is an object of the present invention to provide an ID chip or an IC card in which the mechanical strength of an integrated circuit can be enhanced without suppressing a circuit scale.

An ID chip or an IC card of the present invention has an integrated circuit in which a TFT (a thin film transistor) is formed from an insulated thin semiconductor film. Further, an ID chip or an IC card of the present invention has a light-emitting element and a light-receiving element using a non-single-crystal thin film for a layer conducting photoelectric conversion. Such a light-emitting element or a light-receiving element may be formed consecutively to (integrally with) an integrated circuit or may be formed separately and attached to an integrated circuit.

Note that an integrated circuit, a light-emitting element and a light-receiving element may be formed directly on a substrate, or may be formed on a substrate, then separated therefrom, and attached to another substrate that is prepared separately.

The light-receiving element can convert a first signal sent from a reader/writer to an electrical signal (a first electrical signal) and send the first electrical signal to an integrated circuit. The integrated circuit operates in accordance with the first electrical signal sent from the light-receiving element. Specifically, the integrated circuit can generate a second electrical signal to be transmitted to a reader/writer and send it to a light-emitting element. The light-emitting element can convert the second electrical signal transmitted from the integrated circuit to a second optical signal and send the second optical signal to the reader/writer.

An ID chip or an IC card of the present invention can adopt a mode having an antenna as well as an integrated circuit, a light-emitting element and a light-receiving element. A chip of the present invention on which an antenna is mounted is also called a radio frequency chip. The integrated circuit can generate a power supply voltage from alternating voltage generated by an antenna. Note that the antenna may be formed on the same substrate as the integrated circuit or may be formed separately from the integrated circuit and then electrically connected to the integrated circuit. If an ID chip or an IC card of the present invention has no antenna, the integrated circuit has a connection terminal for electrically connecting with an antenna.

Alternatively, an ID chip or an IC card of the present invention may have a battery instead of an antenna.

Further, an ID chip, an IC card or a radio frequency chip of the present invention is also called a semiconductor device.

The attachment of an integrated circuit to a substrate may, for example, be carried out according to various kinds of methods as follows: a metal oxide film is formed between a high heat resistant substrate and an integrated circuit, and the metal oxide film is crystallized and weakened to separate the integrated circuit, thereby attaching the integrated circuit to an object; a separation layer is provided between a high heat resistant substrate and an integrated circuit, the separation layer is removed by laser irradiation or by etching to separate the integrated circuit, thereby attaching the integrated circuit to an object; a high heat resistant substrate over which an integrated circuit is formed is mechanically removed or is removed by etching using a solution or a gas to separate the integrated circuit, thereby attaching the integrated circuit to an object.

Integrated circuits, which are formed separately, may be attached to one another to stack the integrated circuits such that the scale of the circuits or the memory capacity may be increased. Since the respective integrated circuits are dramatically thin in thickness as compared with an ID chip manufactured using a semiconductor substrate, the mechanical strength of an ID chip can be maintained to some extent even when the plural integrated circuits are stacked. The stacked integrated circuits can be connected to one another by using a known connection method such as a flip chip method, a TAB (tape automated bonding) method or a wire bonding method.

A TFT is used in an integrated circuit, a non-single-crystal thin film is used for a layer conducting photoelectric translation in a light-emitting element and a light receiving element, thereby making an ID chip drastically thinner. Since the integrated circuit, the light-emitting element and the light-receiving element do not need a semiconductor substrate, a flexible substrate can be used. Therefore, high mechanical strength can be obtained without reducing the area, unlike an integrated circuit using a semiconductor substrate. Therefore, the mechanical strength of an integrated circuit can be enhanced without suppressing the circuit scale, and the application range of an ID chip or an IC card can be enlarged.

Furthermore, according to the present invention, since the integrated circuit is formed using the electrically-isolated TFT, a parasitic diode is difficult to be formed between the integrated circuit and the substrate, unlike a transistor formed over a semiconductor substrate. Therefore, a large amount of current does not flow through a drain region due to a potential of an alternating-current signal that is applied to a source region or the drain region, which rarely causes the deterioration or breakdown. The present invention includes an advantageous effect that radio waves are seldom blocked as compared with an integrated circuit formed by using a semiconductor substrate and thus attenuation of a signal due to blocking of the radio waves can be prevented.

When an integrated circuit, a light-emitting element and a light receiving element are formed integrally, a wiring for connecting the integrated circuit with the light-emitting element or the light receiving element can be integrally formed with the integrated circuit. In addition, if the light-emitting element and the light-receiving element are attached to the integrated circuit, the integrated circuit, the light-emitting element and the light-receiving element are easily formed integrally, since the light-emitting element and the light-receiving element are formed by using thin films. Therefore, in both cases, generation of connection failure can be suppressed in forming an ID chip or an IC card. Further, if a flexible substrate is used, connection failure to be caused by stressing onto the substrate can be also suppressed, which leads to enhancing the reliability.

According to the present invention, transmission/reception of a signal is performed by optical communication and voltage of a power supply is supplied by radio waves. Therefore, it is possible that higher voltage of the power supply can be supplied to an integrated circuit as compared with the case of performing transmission/reception of a signal and supplying the voltage of a power supply when only an optical signal is used. Therefore, communication range can be lengthened, and constraint in design of an integrated circuit by a power supply voltage can be reduced.

Moreover, a communication area can be more easily limited as compared with the case of performing transmission/reception of a signal and supplying the voltage of a power supply when only radio waves are used. Therefore, overlapped communication areas and interfered signals can be prevented even when communication is conducted by radio waves having the same frequency band as another communication device. And also, by using optical signals, high communication speed can be secured and a signal including large volumes of data can be sent and received. In addition, since transmission/reception of signals is above Radio Law in the case of using optical signals, communication range can be lengthened as long as a power supply voltage is supplied surely.

BRIEF DESCRIPTION OF DRAWINGS

In the accompanying drawings:

FIGS. 1A and 1B are a perspective view and a block diagram of an ID chip according to one aspect of the present invention, respectively;

FIGS. 5A to 5D each show a manufacturing method of an ID chip according to one aspect of the present invention;

FIGS. 6A to 6C each show a manufacturing method of an ID chip according to one aspect of the present invention;

FIGS. 7A to 7C each show a manufacturing method of an ID chip according to one aspect of the present invention;

FIGS. 8A and 8B each show a manufacturing method of an ID chip according to one aspect of the present invention;

FIGS. 9A to 9C each show a manufacturing method of an ID chip according to one aspect of the present invention;

FIGS. 11A and 11B each show a cross-section of an ID chip or an IC card according to one aspect of the present invention;

FIGS. 12A and 12B each show a cross-section of an ID chip or an IC card according to one aspect of the present invention;

FIGS. 13A and 13B each show a cross-section of an ID chip or an IC card according to one aspect of the present invention;

BEST MODE FOR CARRYING OUT THE PRESENT INVENTION

Figure 2A:
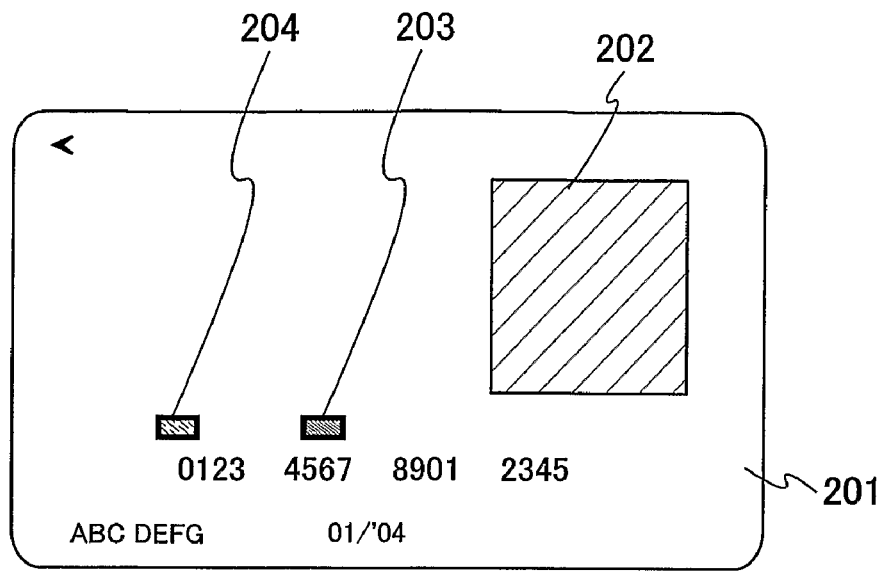
FIGS. 2A and 2B show an appearance and an internal structure of an IC card according to one aspect of the present invention, respectively.

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes given below.

A structure of an ID chip according to the present invention will be described with reference to FIGS. 1A and 1B. FIG. 1A is a perspective view of one mode of the ID chip according to the present invention. Reference numeral 100 denotes an integrated circuit, 101 denotes a light-receiving element, 102 denotes a light-emitting element, and 103 denotes an antenna. The light-receiving element 101, the light-emitting element 102 and the antenna 103 are all electrically connected to the integrated circuit 100. The integrated circuit 100, the light-receiving element 101, the light-emitting element 102 and the antenna 103 are formed on a substrate 104. A cover material 105 overlaps the substrate 104, while sandwiching the integrated circuit 100, the light-receiving element 101, the light-emitting element 102 and the antenna 103 therebetween.

In FIG. 1A, the antenna 103, in addition to the integrated circuit 100, is sandwiched between the substrate 104 and the cover material 105. However, the present invention is not limited to this structure. For example, the antenna 103 may be formed on the side opposite to the substrate 104 with respect to the cover material 105. An opening portion may be formed in the cover material 105 and the integrated circuit 100 may be electrically connected to the antenna 103 through the opening portion.

The ID chip of the present invention does not necessarily have the antenna 103. If the antenna 103 is not included in the ID chip, a connection terminal for electrically connecting the antenna 103 is provided for the ID chip.

FIG. 1A shows an example of enhancing the mechanical strength of the ID chip by using the cover material 105. However, the ID chip of the present invention does not necessarily have the cover material 105. For example, the integrated circuit 100, the light-receiving element 101, the light-emitting element 102 and the antenna 103 may be covered with resin or the like, thereby enhancing the mechanical strength of the ID chip.

FIG. 1B is a block diagram showing a functional structure of the ID chip of the present invention shown in FIG. 1A.

The integrated circuit 100 includes a rectification circuit 110 for rectifying alternating voltage generated in the antenna 103, and a power supply circuit 111 for generating direct-current power supply voltage from the rectified voltage. Note that reference numeral 118 in FIG. 1B corresponds to a capacitor connected to opposite terminals of the antenna 103. The power supply voltage generated in the power supply circuit 111 is supplied to various circuits in the integrated circuit 100.

Further, the integrated circuit 100 includes a demodulation circuit 112 for demodulating an electrical signal sent from the light-receiving element 101, a logic circuit 113 conducting various arithmetic operations by using the demodulated electrical signal in the demodulation circuit 112, a memory 114 storing various data including a program, and a memory control circuit 115 that specifies an address of the memory 114 depending on a signal from the logic circuit 113 and writes in or reads out data. In addition, the logic circuit 113 can generate an electrical signal to be transmitted to a reader/writer by using various arithmetic operations or data stored in the memory 114. The electrical signal generated in the logic circuit 113 is converted to an optical signal in the light-emitting element 102 and transmitted to the reader/writer.

FIG. 1B shows an example of the integrated circuit 100 having one logic circuit 113, but the present invention is not limited to this structure. A plurality of logic circuits 113 may be provided in accordance with the content of arithmetic operations conducted in the logic circuit 113. In addition, the electrical signal converted from the optical signal in the light-receiving element 101 may be amplified in an amplifier 116 before it is demodulated in the demodulation circuit 112. Alternatively, the electrical signal generated in the logic circuit 113 may be amplified in the amplifier 117 before it is sent to the light-emitting element 102.

One memory 114 is not necessarily used and a plurality of memories may be used. Various semiconductor memories such as DRAM, SRAM, a flash memory, ROM or FRAM (a registered trademark) can be used. The memory 114 can be used as an operation area at the time of arithmetic operation.

In FIG. 1B, an oscillation circuit that can generate alternating voltage, and a modulation circuit that gives modulation to the alternating voltage generated in the oscillation circuit according to the electrical signal generated in the logic circuit 113 may be included. In this case, the light-emitting element 102 can convert the modulated alternating voltage to an optical signal and the optical signal can be transmitted to the reader/writer.

The method for transmitting radio waves for supplying voltage of a power supply is not limited to the electromagnetic coupling method as shown in FIGS. 1A and 1B. An electromagnetic induction method, a microwave method and other transmitting methods may be used.

An insulated TFT is used for the integrated circuit 100. Various kinds of semiconductor elements can be used without being limited to a TFT as the semiconductor element used in the integrated circuit 100. In addition to a TFT, for example, a memory element, a diode, a photoelectric conversion element, a resistor element, a coil, a capacitor element, an inductor and the like can typically be employed.

A structure of an IC card according to the present invention will be described with reference to FIGS. 2A, 2B and 3. FIG. 2A shows an appearance of the IC card according to the present invention. Reference numeral 201 denotes a card body, 202 denotes a pixel portion of a display device 207 installed in the card body 201, 203 denotes a light-receiving element and 204 denotes a light-emitting element.

Figure 2B:
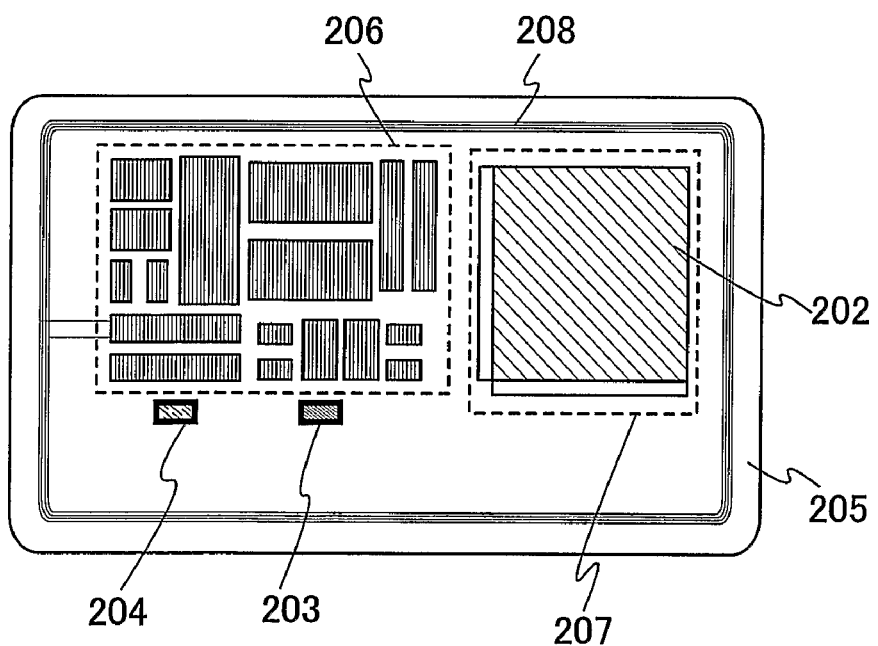

FIG. 2B shows a configuration of a substrate 205 included in the card body shown in FIG. 2A. An integrated circuit 206 formed by using a thin semiconductor film, the light-receiving element 203, the light-emitting element 204, the display device 207 and the antenna 208 are formed on the substrate 205.

FIG. 2B shows an example in which the antenna 208 is formed together with the integrated circuit 206, the light receiving element 203 and the light-emitting element 204, but an IC card of the present invention is not limited to this configuration. An antenna that is prepared separately from the integrated circuit 206 may be electrically connected to the integrated circuit 206. In this case, for example, a material formed by winding a copper wire or the like in a coil and pressing it sandwiched by two plastic films, each having a thickness of about 100 μm, can be used as the antenna.

Only one antenna 208 is used for one IC card in FIG. 2B, but a plurality of antennas 208 may be used.

FIGS. 2A and 2B each show the structure of the IC card having the display device 207, but the present invention is not limited to this structure and the display device is not necessarily provided. However, a display device is provided, and thus, it is possible to display data of a photograph of a human face in the display device and to make replacing the photograph of a human face more difficult as compared with the case of using the printing method. Moreover, information other than the photograph of a human face can be displayed and a higher function IC card can be obtained.

Figure 3:
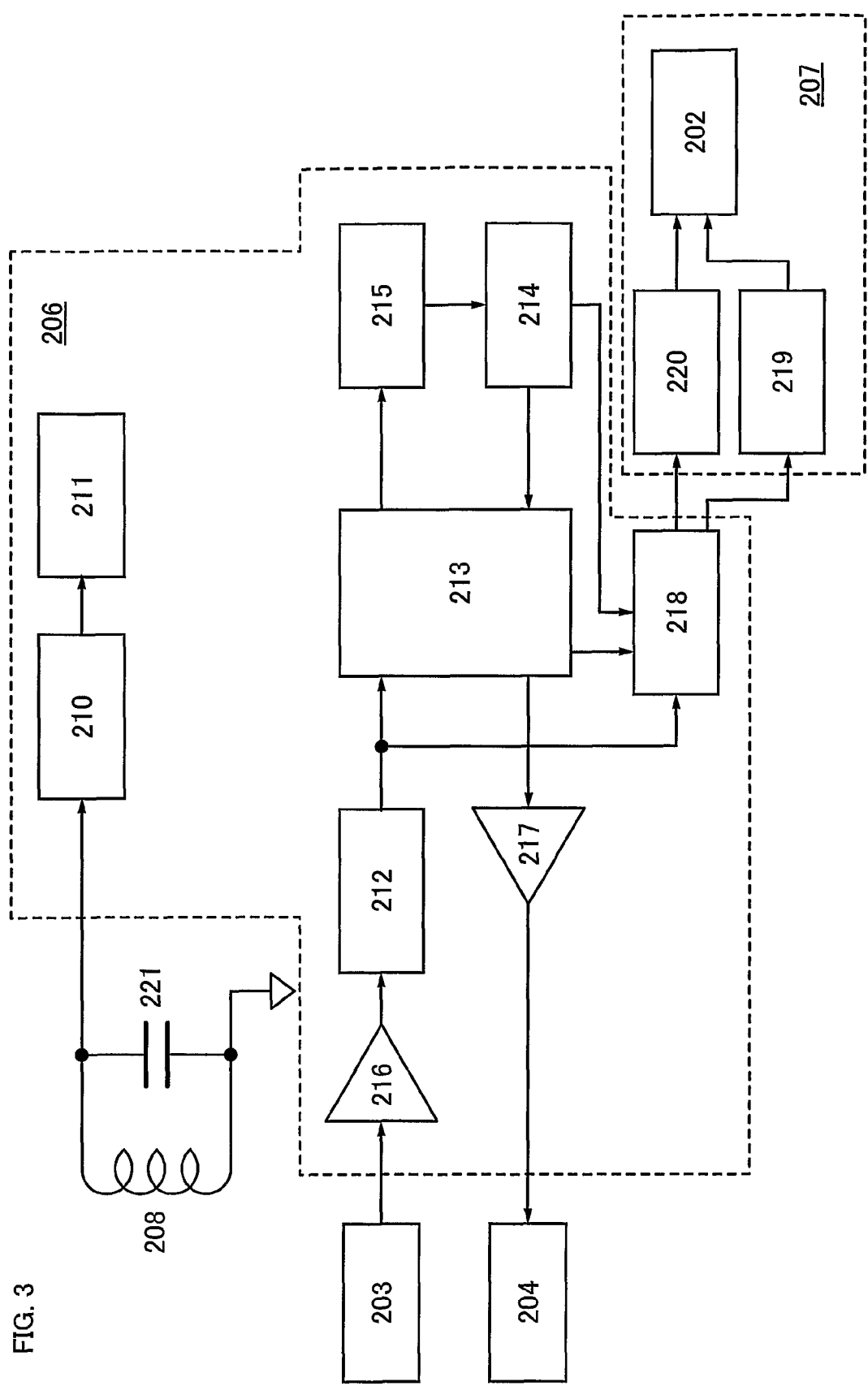
FIG. 3 is a block diagram showing a function of an IC card according to one aspect of the present invention.

FIG. 3 is a block diagram showing a functional configuration of the IC card of the present invention shown in FIG. 2B.

The integrated circuit 206 includes a rectification circuit 210 and a power supply circuit 211, like the ID chip shown in FIG. 1B. Reference numeral 221 corresponds to a capacitor connected between opposite terminals of the antenna 208. The integrated circuit 206 includes the demodulation circuit 212, the logic circuit 213, the memory 214 and the memory control circuit 215. Further, the integrated circuit 206 may include an amplifier 216 for amplifying an electrical signal before the electrical signal is demodulated in the demodulation circuit 212, and an amplifier 217 for amplifying an electrical signal before the electrical signal is transmitted to the light-emitting element 204. Specific structures and operations of various circuits included in this integrated circuit 206 can be referred to the description of FIG. 1B.

In FIG. 3, as for the IC card of the present invention shown in FIG. 2B, the integrated circuit 206 includes a control circuit 218 for generating various signals to be transmitted to the display device 207. A signal generated in the control circuit 218 is transmitted to a signal line driver circuit 219 and a scanning line driver circuit 220 of the display device 207. The operation of the pixel portion 202 is controlled by the signal line driver circuit 219 and the scanning line driver circuit 220, and thus an image can be displayed on the pixel portion 202.

Note that the IC card shown in FIG. 3 may include an oscillation circuit that can generate alternating voltage, and a modulation circuit to add modulation to the alternating voltage generated in the oscillation circuit according to an electrical signal generated in the logic circuit 213. In this case, the light-emitting element 204 can convert the modulated alternating voltage to an optical signal and transmit the electrical signal to the reader/writer.

The method for transmitting radio waves for supplying voltage of a power supply is not limited to the electromagnetic coupling method as shown in FIGS. 2B and 3. An electromagnetic induction method, a microwave method and other transmitting methods may be used.

An insulated TFT is used for the integrated circuit 206. Various kinds of semiconductor elements can be used without being limited to a TFT as the semiconductor element used in the integrated circuit 206. In addition to a TFT, for example, a memory element, a diode, a photoelectric conversion element, a resistor element, a coil, a capacitor element, an inductor and the like can typically be employed.

Figure 4A:
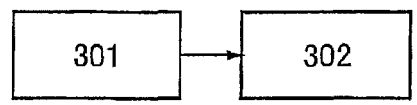
FIGS. 4A and 4B are a block diagram showing a part that generates a power supply voltage in an integrated circuit and an appearance of an IC card using a solar battery, respectively.

In the ID chips or IC cards shown in FIGS. 1A, 1B, 2A, 2B and 3, a power supply voltage is supplied by radio wave, but the present invention is not limited to this structure. A power supply voltage may be supplied to the integrated circuit by using a battery instead of the antenna. Only a portion that generates power supply voltage in the integrated circuit is shown in a block diagram of FIG. 4A. In FIG. 4A, reference numeral 301 denotes a battery and 302 denotes a power supply circuit. The power supply circuit can generate power supply voltage having a value (height) necessary for various circuits by using a power supply voltage supplied from the battery 301. Note that a chemical cell, a photovoltaic cell and the like can be employed as the battery 301.

Figure 4B:
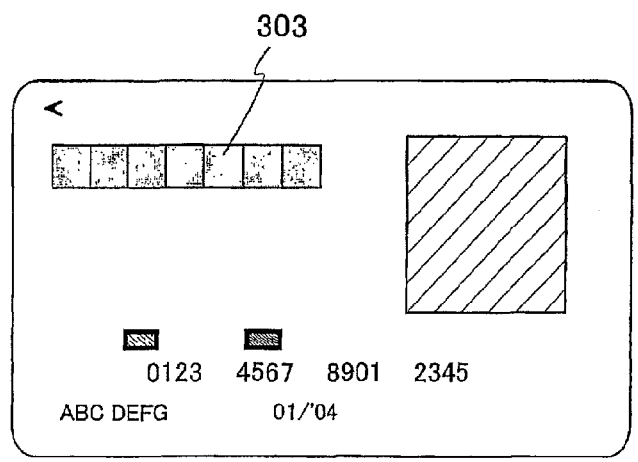

FIG. 4B shows an appearance of an IC card using a solar battery 303 that is a kind of photovoltaic cells. The IC card can be used by using the solar battery 303 instead of replacing the battery or charging the battery. A battery for assisting power supply voltage may be used for the ID chip or IC card in addition to the antenna.

A specific manufacturing method of the ID chip of the present invention will described. In this embodiment mode, an insulated TFT and a photodiode used as a light-receiving element are shown as examples of semiconductor elements. However, the semiconductor element used in the integrated circuit is not limited to these examples and various circuit elements can be used.

As shown in FIG. 5A, a separation layer 501 is formed by a sputtering method on a heat resistant substrate (a first substrate) 500. For example, glass substrates such as a barium borosilicate glass and an alumino borosilicate glass, a quartz substrate, a ceramic substrate and the like can be used for the first substrate 500. In addition, a metal substrate including a stainless (SUS) substrate or a semiconductor substrate on which an insulating film is formed may be used. A substrate made of synthetic resin having flexibility such as plastic generally has a tendency in which the allowable temperature limit is lower than the above described substrates, but it can be used as long as it can resist the processing temperature in the manufacturing steps.

An amorphous silicon film, a polycrystalline silicon film, a single crystal silicon film, a micro crystalline silicon film (including a semiamorphous silicon film) and the like which mainly include silicon can be used for the separation layer 501. The separation layer 501 can be formed by a sputtering method, a low pressure CVD method, a plasma CVD method or the like. In this embodiment mode, an amorphous silicon of about 50 nm thick is formed by a low pressure CVD method and is used as the separation layer 501. The separation layer 501 is not limited to silicon and a material that can be removed selectively by etching may be used. The thickness of the separation layer 501 is preferably 50 nm to 60 nm. The thickness of semiamorphous silicon may be 30 nm to 50 nm.

A base film 502 is formed over the separation layer 501. The base film 502 is provided to prevent an alkali metal such as Na or an alkali earth metal contained in the first substrate 500 from diffusing into the semiconductor film and adversely affecting characteristics of the semiconductor element such as a TFT. In addition, the base film 502 also has a function of protecting the semiconductor element in the later step of separating the semiconductor element. The base film 502 may have a single layer or a plurality of laminated insulating films. Therefore, the base film 502 is formed by using an insulating film such as silicon oxide, silicon nitride or silicon nitride oxide that can prevent an alkali metal or an alkali earth metal from diffusing into the semiconductor film.

In this embodiment mode, a SiON film of 100 nm thick, a SiNO film of 50 nm thick, and a SiON film of 100 nm are sequentially formed to form the base film 502, and the material, thickness, number of laminations of each film are not limited thereto. For example, instead of the SiON film in the lower layer, siloxane resin of 0.5 μm to 3 μm in film thickness may be formed by a spin coating method, a slit coating method, a droplet discharging method, a printing method or the like. Instead of the SiNO film in the middle layer, a silicon nitride film (such as SiNx or $Si_3N_4$) may be formed. Instead of the SiON film in the upper layer, a $SiO_2$ film may be used. In addition, the thickness of each film is preferably 0.05 μm to 3 μm and can be freely selected from the range of 0.05 μm to 3 μm.

Alternatively, the lower layer of the base film 502 that is closest to the separation layer 501 may be formed from a SiON film or a $SiO_2$ film, the middle layer may be formed from siloxane resin, and the upper layer may be formed from a $SiO_2$ film.

The droplet discharging method is a method for forming a predetermined pattern by discharging droplets containing a predetermined composition from a minute hole, which includes an ink jetting method. The printing method includes a screen-printing method, an offset printing method and the like.

The silicon oxide film can be formed by a thermal CVD method, a plasma CVD method, an atmospheric pressure CVD method, a bias ECRCVD method or the like using a mixture gas of $SiH_4/O_2$, TEOS (tetraethoxysilane)/$O_2$ or the like. In addition, the silicon nitride film can typically be formed by a plasma CVD method using a mixture gas of $SiH_4/NH_3$. In addition, the silicon oxynitride film (SiOxNy: x>y) and the silicon nitride oxide film (SiNxOy: x>y) can typically be formed by a plasma CVD method using a mixture gas of $SiH_4/N_2O$.

A semiconductor film 503 is formed over the base film 502. Preferably, the semiconductor film 503 is formed without being exposed to the air after forming the base film 502. The thickness of the semiconductor film 503 is set to be 20 to 200 nm (desirably, 40 to 170 nm, more preferably, 50 to 150 nm). The semiconductor film 503 may be an amorphous semiconductor, a semiamorphous semiconductor or a polycrystalline semiconductor. Silicon germanium as well as silicon can also be used as the semiconductor film. When using silicon germanium, the concentration of germanium is preferably set to be about 0.01 to 4.5 atomic %.

The semiconductor film 503 may be crystallized by a known method. A laser crystallization method using laser light and a crystallization method using a catalytic element are given as the known crystallization methods. Alternatively a method that combines the crystallization method using a catalytic element and the laser crystallization method can be used. When an excellent heat resistant substrate like quartz is used as the first substrate 500, any of a thermal crystallization method using an electrically-heated furnace, a lamp annealing crystallization method using infrared light, and the crystallization method using a catalytic element may be combined with high temperature annealing of about 950° C. as a crystallization method.

In the case of the laser crystallization, for example, the semiconductor film 503 is subjected to thermal annealing at 500° C. for one hour to enhance a resistance property with respect to a laser beam prior to performing laser crystallization. A continuous wave solid-state laser is used and a laser beam with second to fourth harmonics of the fundamental wave is irradiated to obtain a crystal having a large grain size. Typically, for instance, the second harmonic (532 nm) or the third harmonic (355 nm) of Nd:YVO$_4$ laser (fundamental wave with 1064 nm) is preferably used. Concretely, a laser beam emitted from the continuous wave YVO$_4$ laser is converted into a harmonic by a nonlinear optical element to obtain a laser beam with 10 W output. The laser beam is preferably formed to have a rectangular shape or an elliptical shape on a surface of the semiconductor film 503 to be irradiated with the laser beam. In this case, the power density of about 0.01 to 100 MW/cm$^2$ (preferably, 0.1 to 10 MW/cm$^2$) is required. The scanning rate is approximately set to be 10 to 2,000 cm/sec to irradiate the semiconductor film.

While the oscillation frequency of a pulsed laser beam is set to be 10 MHz or more, laser crystallization may be carried out using a much higher frequency band than a frequency band of several tens Hz to several hundreds Hz, which is generally used. The period from irradiating a pulsed laser beam onto the semiconductor film to curing the semiconductor film completely is considered to be several tens nsec to several hundreds nsec. By utilizing the above-mentioned frequency band, the next pulsed laser beam can be irradiated to the semiconductor film until the semiconductor film is melted due to irradiation of a laser beam and then solidified. Therefore, a solid-liquid interface can be moved continuously in the semiconductor film, so that the semiconductor film having crystal grains, which are continuously grown in the scanning direction, is formed. Specifically, an aggregate of the crystal grains each of which has a width of 10 to 30 μm in a scanning direction and a width of 1 to 5 μm in a direction perpendicular to the scanning direction can be obtained. The semiconductor film in which almost no crystal grain boundaries are formed in the channel direction of a TFT can be formed by forming the single crystal grains growing in the scanning direction.

As for the laser crystallization, laser light of the fundamental wave of a continuous wave laser and laser light of the harmonic of a continuous wave laser may be irradiated in parallel. Alternatively, laser light of the fundamental wave of a continuous wave laser and laser light of the harmonic of a pulsed laser may be irradiated in parallel.

A laser beam may be irradiated under an inert gas atmosphere such as rare gas and nitrogen.

By the above described laser irradiation, the semiconductor film 503 with improved crystallinity is formed. Note that a polycrystalline semiconductor may in advance be formed by a sputtering method, a plasma CVD method, a thermal CVD method or the like.

The semiconductor film 503 is crystallized in this embodiment mode, but an amorphous silicon film or a microcrystalline semiconductor film may be used in the next process without performing the crystallization. A TFT using an amorphous semiconductor or a microcrystalline semiconductor needs fewer manufacturing steps than a TFT using a polycrystalline semiconductor, and thus, has advantageous effects of reducing costs and enhancing yield.

The amorphous semiconductor can be obtained by performing glow discharge decomposition of silicide gas. Typically, SiH$_4$ and Si$_2$H$_6$ are cited as examples for the silicide gas. These silicide gases may be diluted with hydrogen or hydrogen and helium.

A semiamorphous semiconductor has an intermediate structure between an amorphous structure and a crystalline structure (including a single crystalline structure, and a polycrystalline structure), and a third state that is stable with respect to free energy. Such a semiamorphous semiconductor has a crystal structure that includes a short range order and lattice distortion. Crystal grains of 0.5 nm to 20 nm in size can be contained and dispersed in a non-single crystal semiconductor. As for the semiamorphous semiconductor, the Raman spectrum shifts to the lower side of a wave number of 520 cm$^{-1}$, and a diffraction peak of (111) and (220) derived from a silicon crystal lattice is observed in x-ray diffraction. Further, the semiamorphous semiconductor contains hydrogen or halogen of 1 atom % or more for terminating a dangling bond. Herein, such the semiconductor is referred to as a semiamorphous semiconductor (SAS) for convenience. When a rare gas element such as helium, argon, krypton, or neon is mixed into a SAS (semiamorphous semiconductor), the lattice distortion is further increased and the stability is thus enhanced, thereby obtaining an excellent semiamorphous semiconductor (SAS).

The SAS is formed by glow discharge decomposition of silicide gas. SiH$_4$ is a representative silicide gas. In addition to SiH$_4$, Si$_2$H$_6$, SiH$_2$Cl$_2$, SiHCl$_3$, SiCl$_4$, SiF$_4$ and the like can be used as the silicide gas. The silicide gas may also be diluted with hydrogen, or a mixture of hydrogen and one or more rare gas elements selected from helium, argon, krypton, and neon so that the SAS can be easily formed. The dilution ratio is preferably set to be in the range of 1:2 to 1:1,000. In addition, a carbide gas such as CH$_4$ and C$_2$H$_6$ or germanium gas such as GeH$_4$ or GeF$_4$, or F$_2$ may be mixed in the silicide gas so that the width of the energy band may be adjusted in the range of 1.5 to 2.4 eV or 0.9 to 1.1 eV.

In the case of using a gas containing a mixture of SiH$_4$ and H$_2$ or a gas containing a mixture of SiH$_4$ and F$_2$, for example, when a TFT is manufactured using the semiamorphous semiconductor, the subthreshold coefficient (S value) of the TFT can be set to be 0.35 V/sec or lower, typically, 0.25 to 0.09 V/sec, and the mobility thereof can be set to be 10 cm$^2$/Vsec. For example, when a 19-stage ring oscillator is formed by using the TFT using the above semiamorphous semiconductor, a characteristic of the oscillation frequency of 1 MH or more, preferably 100 MHz or more at the power supply voltage of 3 to 5 V can be obtained. In addition, the delay time for each stage of an inverter can be 26 ns, preferably 0.26 ns or less at the power supply voltage of 3 to 5 V.

As shown in FIG. 5B, the semiconductor film 503 is patterned to form island-like semiconductor films 504 to 507. A gate insulating film 508 is formed to cover the island-like semiconductor films 504 to 507. A film including silicon nitride, silicon oxide, silicon nitride oxide or silicon oxynitride as a single layer or a lamination layer can be formed as the gate insulating film 508 by a plasma CVD method or a sputtering method. In laminating the films, for example, a three-layer structure in which a silicon oxide film, a silicon nitride film and a silicon oxide film are stacked in this order on the substrate is preferably employed.

After forming the gate insulating film 508, a heat treatment may be carried out at 300 to 450° C. for 1 to 12 hours under an atmosphere containing 3 to 100% hydrogen so as to hydrogenate the island-like semiconductor films 504 to 507. As another hydrogenation method, plasma hydrogenation (using hydrogen excited by plasma) may be performed. Through the hydrogenation step, dangling bonds can be terminated by the thermally excited hydrogen. If defects are caused in the semiconductor film by bending a second substrate 545 after attaching the semiconductor elements to the flexible second substrate 545 in the subsequent step, the concentration of hydrogen contained in, the semiconductor film is set to be $1\times10^{19}$ to $1\times10^{22}$ atoms/cm$^3$, preferably, $1\times10^{19}$ to $5\times10^{20}$ atoms/cm$^3$ by hydrogenation, so that the defects can be terminated by the hydrogen contained in the semiconductor film. In addition, halogen may be contained in the semiconductor film to terminate the defects.

Next, gate electrodes 509 to 512 are formed as shown in FIG. 5C. In this embodiment mode, after laminating Si and W by a sputtering method, the gate electrodes 509 to 512 are formed by etching using resist 513 as a mask. Of course, the material, structure, and manufacturing method of the gate electrodes 509 to 512 are not limited thereto and can be selected appropriately. For example, a lamination structure of NiSi (nickel silicide) with Si with an n-type impurity added, or a lamination structure of TaN (tantalum nitride) with W (tungsten) may be employed. In addition, the gate electrode may be formed as a single layer of various conductive materials.

A mask of SiOx or the like may be used instead of a resist mask. In this case, a step of patterning is added to form a mask of SiOx, SiON or the like (it is called a hard mask) but the thickness of the mask is reduced less in etching than that of a resist mask. Thus, the gate electrodes 509 to 512 having a desired width can be formed. Alternatively, the gate electrodes 509 to 512 may be formed selectively by a droplet discharging method without using the resist 513.

Various materials can be selected as the conductive material according to the function of the conductive film. If the gate electrode and the antenna are formed simultaneously, materials thereof may be selected considering the function.

Using an etching method, a mixture of gases CF$_4$, Cl$_2$ and O$_2$ or a Cl$_2$ gas is used as the etching gas in forming the gate electrodes, but the etching gas is not limited to these.

As shown in FIG. 5D, the island-like semiconductor film 505 to become a p-channel TFT is covered with resist 514 and an n-type impurity element (typically, phosphorus or arsenic) is doped into the island-like semiconductor films 504, 506 and 507 to form a low concentration region using the gate electrodes 509, 511 and 512 as masks (a first doping step). The condition of the first doping step is as follows: the dose amount of $1\times10^{13}$ to $6\times10^{13}$/cm$^2$, and the accelerating voltage of 50 to 70 keV. However, the condition is not limited thereto. Pairs of low concentration impurity regions 515 to 517 are formed in the island-like semiconductor films 504, 506 and 507 by doping through the gate insulating film 508 by this first doping step. Note that the first doping step may be conducted without covering the island-like semiconductor 505 to become a p-channel TFT with resist.

Next, as shown in FIG. 6A, after resist 514 is removed by ashing or the like, a new resist 518 is formed to cover the island-like semiconductor films 504, 506 and 507 to become n-channels TFT. An impurity element (typically, boron) imparting a p-type conductivity is doped into the island-like semiconductor film 505 to form a high concentration region using the gate electrode 510 as a mask (second doping step). The condition of the second doping step is as follows: the dose amount of $1\times10^{16}$ to $3\times10^{16}$/cm$^2$, and the accelerating voltage of 20 to 40 keV. A pair of p-type high concentration impurity regions 519 is formed in the island-like semiconductor film 505 by doping through the gate insulating film 508 by performing the second doping step.

Next, as shown in FIG. 6B, after the resist 518 is removed by ashing or the like, an insulating film 520 is formed to cover the gate insulating film 508 and the gate electrodes 509 to 512. In this embodiment mode, an SiO$_2$ film of 100 nm thick is formed by a plasma CVD method. After that, the insulating film 520 and the gate insulating film 508 are etched partially by an etchback method. As shown in FIG. 6C, sidewalls 521 to 524 are formed in a self-alignment manner to be in contact with the sidewalls of the gate electrodes 509 to 512. A mixture gas of CHF$_3$ and He is employed as the etching gas. Note that the step of forming the sidewalls is not limited thereto.

When forming the insulating film 520, there is a risk that an insulating film is also formed on the rear surface of the first substrate 500. In this case, the insulating film formed on the backside of the first substrate 500 may be selectively etched and removed by using resist. In this case, the insulating film formed on the rear surface may be etched and removed together with the insulating film 520 and the gate insulating film 508 in the process of forming the sidewalls 521 to 524 by the etchback method.

As shown in FIG. 7A, a new resist 525 is formed to cover the island-like semiconductor 505 to become a p-channel TFT, an n-type impurity element (typically, P or As) is doped to form a high concentration region using the gate electrodes 509, 511 and 512 and the sidewalls 521, 523 and 524 as masks (the third doping step). The condition of the third doping step is as follows: the dose amount of $1\times10^{13}$ to $5\times10^{15}$/cm$^2$, and the accelerating voltage of 60 to 100 keV. Pairs of n-type high concentration impurity regions 526 to 528 are formed in the island-like semiconductor films 504, 506 and 507 by performing the third doping step.

When n-type impurities are doped to form a high concentration region, the sidewalls 521, 523 and 524 function as masks to form a low concentration impurity region or an off-set region in which doping is not done in a lower part of the sidewalls 521, 523 and 524. Therefore, the size of the sidewalls 521, 523 and 524 may be adjusted by appropriately changing the thickness of the insulating film 520, and the conditions of an etchback method in forming the sidewalls 521, 523 and 524, so as to control the width of the low concentration impurity region or the off-set region.

After the resist 525 is removed by ashing or the like, thermal activation may be carried out to the impurity region. For example, a SiON film of 50 nm is formed and then may be exposed to a heat treatment in a nitrogen atmosphere at 550° C. for four hours. A SiNx film containing hydrogen is formed to be 100 nm thick, and then, is exposed to a heat treatment in a nitrogen atmosphere at 410° C. for one hour to correct defects of the polycrystalline semiconductor film. This is called, for example, a hydrogen treatment process, which terminates dangling bonds in the polycrystalline semiconductor film.

Through the above described series of steps, n-channel TFTs 529, 531 and 532 and a p-channel TFT 530 are formed. Note that the n-channel TFT 531 can be used as a photodiode. In the above described manufacturing steps, the conditions of an etchback method are changed appropriately and the sizes of the sidewalls are adjusted to form TFTs having a channel length of 0.2 μm to 2 μm. It is noted that, in this embodiment mode, a bottom gate structure (an inverted staggered structure) may be employed although a top gate structure is employed for the 529 to 532.

Additionally, thereafter, a passivation film to protect the TFT 529 to 532 may be formed. Thus, the passivation film is preferably formed by using silicon nitride, silicon nitride oxide, aluminum nitride, aluminum oxide, silicon oxide or the like which can prevent an alkali metal or an alkali earth metal from entering the TFTs 529 to 532. Specifically, for example, a SiON film of about 600 nm thick can be used for the passivation film. In this case, the hydrogen treatment process may be conducted after forming the SiON film. Like this, a three-layer structure of insulating films SiON\SiNx\SiON stacked in this order is formed over the TFT 529 to 532, but the structure or materials thereof are not limited thereto. By the above described structure, the TFT 529 to 532 are covered with the base film 502 and the passivation film, thereby further preventing an alkali metal such as Na or an alkali earth metal from diffusing into the semiconductor film used in a semiconductor element and from adversely affecting characteristics of the semiconductor element.

Next, a first interlayer insulating film 533 is formed to cover the TFTs 529 to 532 as shown in FIG. 7B. Organic resin having heat-resistance such as polyimide, acryl or polyamide can be used for the first interlayer insulating film 533. Besides the organic resin, a low dielectric constant material (a low-k material) or a resin containing Si—O—Si bond (hereinafter, referred to as a siloxane resin) or the like can be used. Siloxane has a skeleton structure with a bond of silicon (Si) and oxygen (O). As a substitute thereof, an organic group including at least hydrogen (such as alkyl group or aromatic hydrocarbon) is used. Further, a fluoro group may be used for the substitute. Also, an organic group including at least hydrogen and a fluoro group may be used for the substitute. In forming the first interlayer insulating film 533, a spin-coating method, a dipping method, a spray coating method, a droplet discharging method (an ink-jet method, a screen-printing method, an off-set printing method and the like) a doctor knife, a roll coater, a curtain coater, a knife coater, and the like can be employed depending on the material of the interlayer insulating film. Further, an inorganic material may be used. At this time, a silicon oxide film, a silicon nitride film, a silicon oxynitride film, a PSG (phosphorus silicate glass) film, a PBSG (phosphorus boron silicate glass) film, a BPSG (borophosphosilicate glass) film, an alumina film and the like can be used. Note that these insulating films may be laminated to form the first interlayer insulating film 533.

Further, in this embodiment mode, a second interlayer insulating film 534 may be formed over the first interlayer insulating film 533. As for the second interlayer insulating film 534, a film containing carbon such as DLC (Diamond Like Carbon) or carbon nitride (CN), a silicon oxide film, a silicon nitride film, a silicon nitride oxide film, or the like can be employed. As for the forming method, plasma CVD, atmospheric pressure plasma, or the like can be employed. Alternatively, a photosensitive or nonphotosensitive organic material such as polyimide, acrylic, polyamide, resist, and benzocyclobutene, or a siloxane resin may be employed.

Note that a filler may be mixed into at least one of the first interlayer insulating film 533 and the second interlayer insulating film 534 in order to prevent film detachment or a crack of these films due to stress generated by a difference of a thermal expansion coefficient between the first interlayer insulating film 533 or the second interlayer insulating film 534 and a conductive material of a wiring or the like formed at a subsequent step.

As shown in FIG. 7B, contact holes are formed in the first interlayer insulating film 533 and the second interlayer insulating film 534. Wirings 535 to 541 connecting to the TFTs 529 to 532 are formed. As for an etching gas for forming the contact hole, a mixed gas of CHF$_3$ and He is employed, but the present invention is not limited to this. In this embodiment mode, the wirings 535 to 541 are formed of Al. Here, the wirings 535 to 541 may be formed to have a five-layer structure in which Ti, TiN, Al—Si, Ti and TiN are formed sequentially by sputtering.

By mixing Si into the Al layer, the generation of hillocks can be prevented during resist baking when the wiring is patterned. Instead of the Si, Cu of about 0.5% may be mixed. In addition, by sandwiching the Al—Si layer with Ti or TiN, hillock resistance can be further improved. At the patterning, the above-described hard mask of SiON or the like is preferably employed. Note that the material and the forming method of these wirings are not limited to these, and the aforementioned material for forming the gate electrode may be employed.

The wirings 535 and 536 are connected to the high concentration impurity region 526 of the n-channel TFT 529; the wirings 536 and 537 to the high concentration impurity region 519 of the p-channel TFT 530; the wirings 538 and 539 to the high concentration impurity region 527 of the n-channel TFT 531; and the wirings 540 and 541 to the high concentration impurity region 528 of the n-channel TFT 532, respectively.

As shown in FIG. 7C, a protective film 542 is formed over the second interlayer insulating film 534 to cover the wirings 535 to 541. The protective layer 542 is made from a material that can protect the TFTs 529 to 532 and the wirings 535 to 541 in removing the separation layer 501 by etching in the subsequent step. For example, a water-soluble or alcohol-soluble epoxy resin, acrylate resin or silicon resin is wholly applied to form the protective layer 542.

For forming the protective layer 542 in the embodiment mode, a water-soluble resin (VL-WSKL10 manufactured by Toagosei Co., Ltd.) is applied by a spin coating method to have a thickness of 30 μm and exposed to light for 2 minutes so as to be cured temporarily. Then, the water-soluble resin is further exposed to UV light from a rear face for 2.5 minutes and from a top face for 10 minutes, i.e., for 12.5 minutes in total to be cured completely, thereby forming the protective layer 542. When plural kinds of organic resins are laminated, they might be partly dissolved to each other in coating or baking, or adhesion might be excessively increased depending on the solvents containing in the organic resins. Therefore, when the second interlayer insulating film 534 and the protective layer 542 are both made from organic resins that are soluble in the same solvent, an inorganic insulating film (e.g., a SiN$_X$ film, a SiN$_X$O$_Y$ film, an AlN$_X$ film or an AlN$_X$O$_Y$ film) is preferably formed to cover the second interlayer insulating film 534 such that the protective layer 542 is smoothly removed in the subsequent step.

As shown in FIG. 8A, a groove 543 is formed to separate the ID chips from one another. The groove 543 may be deep enough to expose the underlying separation layer 501. The groove 543 can be formed by dicing, scribing, or the like. When the ID chips formed over the first substrate 500 is not necessarily divided, the groove 543 may not necessarily be formed.

As shown in FIG. 8B, the separation layer 501 is removed by etching. In the embodiment mode, halogen fluoride is used as an etching gas and the gas is introduced through the groove 543. In this embodiment mode, for example, ClF$_3$ (chlorine trifluoride) is employed, and etching is carried out under the conditions as follows: a temperature is set to be 350° C.; a flow rate, 300 sccm; a pressure, 799.8 Pa (6 Torr); and time, 3 hours. Further, ClF$_3$ gas mixed with nitrogen may be used. By using a halogen fluoride such as ClF$_3$, the separation layer 501 is selectively etched, so that the first substrate 500 can be separated from the TFTs 529 to 532. Note that the halogen fluoride may be in either a gas state or a liquid state.

As shown in FIG. 9A, the separated TFTs 529 to 532 are attached to the second substrate 545 with an adhesive agent 544. A material that can attach the second substrate 545 to the base film 502 is employed for the adhesive agent 544. The following examples of various types of curing adhesive agents including a reactive curing adhesive agent, a thermal curing adhesive agent, a light curing adhesive agent such as an ultraviolet curing adhesive agent, an anaerobic curing adhesive agent and the like can be used as the adhesive agent 544.

As the second substrate 545, a glass substrate such as barium borosilicate glass or alumino borosilicate glass or a flexible organic material such as paper and plastics can be used. In addition, a flexible inorganic material may be employed. As the plastic substrate, ARTON (manufactured by JSR Corporation) made from polynorbornene with a polar radical can be used. Also, the following materials can be cited as the plastic substrate: polyester typified by polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PBT), polyimide, acrylonitrile butadiene styrene resin, polyvinyl chloride, polypropylene, polyvinyl acetate, acrylic resin and the like. The second substrate 545 desirably has high thermal conductivity of about 2 to 30 W/mK in order to diffuse the heat generated from the integrated circuit.

Next, a bank 546 is formed over the second interlayer insulating film 534 to cover the wirings 535 to 541 as shown in FIG. 9B. The bank 546 has an opening portion in which parts of the wirings 535 and 541 are exposed. In addition, the bank 546 can be formed by using an organic resin film, an inorganic insulating film or a siloxane based insulating film. Examples of the organic resin film include acryl, polyimide, polyamide, and the like. Examples of the inorganic resin film include silicon oxide, silicon nitride oxide and the like. Specifically, a photosensitive organic resin film is used for the bank 546, and the bank 546 is formed so that the sidewall of the opening portion in which the wiring 541 is exposed has an inclined plane with a successive curvature. Therefore, it is possible to prevent connection of the wiring 541 and an electrode 548 to be formed later. At the time, a mask can be formed by a droplet discharging method or a printing method. Alternatively, the bank 546 itself can be formed by a droplet discharging method or a printing method.

Next, a light-emitting element 549 or an antenna 550 is formed. This embodiment mode shows a mode in which the light-emitting element 549 is formed first, but the antenna 550 may be formed first, or the antenna 550 may be formed together at the same time as when the electrode 548 of the light-emitting element 549 is formed.

Before forming an electroluminescent layer 547 corresponding to a layer conducting photoelectric conversion, a heat treatment in an atmospheric air or a heat treatment in a vacuum atmosphere (vacuum baking) may be performed in order to remove water, oxygen or the like absorbed by the bank 546 and the wiring 541. Specifically, the heat treatment is performed in a vacuum atmosphere, with a substrate temperature of 200° C. to 450° C., preferably 250° C. to 300° C. for about 0.5 to 20 hours. It is desirably set the vacuum atmosphere at $3 \times 10^{-7}$ Torr or less, most preferably at $3 \times 10^{-8}$ Torr or less if possible. In the case where the electroluminescent layer 547 is formed after performing the heat treatment in the vacuum atmosphere, the reliability can be further improved by setting the substrate in the vacuum atmosphere just before forming the electroluminescent layer 547. In order that a surface of the wiring 541, to be used as an anode or a cathode, is flattened, the surface may be cleaned and polished by a CMP method with polyvinyl alcohol porous body or the like before forming the vacuum baking. In addition, the surface of the wiring 541, to be used as an anode or a cathode, may be exposed to ultraviolet irradiation, an oxygen plasma treatment or the like after being polished by a CMP method.

The electroluminescent layer 547 is formed to be in contact with the wiring 541 in the opening portion of the bank 546. The electroluminescent layer 547 may be formed with a single layer or a lamination layer. In this embodiment mode, since the wiring 541 is used as the cathode, an electron injecting layer, an electron transporting layer, a light emitting layer, a hole transporting layer, and a hole injecting layer are sequentially formed over the wiring 541 when the electroluminescent layer 547 is to be formed by using plural layers. Note that a hole injecting layer, a hole transporting layer, a light emitting layer, an electron transporting layer, and an electron injecting layer are sequentially formed to form the electroluminescent layer 547 if the wiring 541 serves as the anode.

Note that a light-emitting element 549 that emits infrared light can be formed by appropriately changing the lamination structure of the electroluminescent layer 547 and the electroluminescent materials used for the layers.

A color filter may be provided to transmit light having a particular wavelength range. The color filter includes a colored layer that can transmit light of a particular wavelength range, or may include a shielding film that can shield visible light, in addition to the colored layer. The color filter may be formed over a cover material for sealing the light-emitting element or over a substrate. In each case, the colored layer or the shielding film can be formed by a printing method or a droplet discharging method.

The electrode 548 is formed to cover the electroluminescent layer 547. The electrode 548 serves as an anode when the wiring 541 serves as a cathode. On the contrary, when the wiring 541 serves as an anode, the electrode 548 serves as a cathode. The manufacturing method of the electrode 548 is preferably selected from a vapor deposition method, a sputtering method, a droplet discharging method and the like depending on the material.

The electroluminescent layer 547 can be formed by a droplet discharging method even when using any one of the following compounds: a high molecular weight organic compound, an intermediate molecular weight organic compound, a low molecular weight organic compound, and an inorganic compound. An intermediate molecular weight organic compound, a low molecular weight organic compound, and an inorganic compound may be formed by a vapor deposition method. Note that the electroluminescent layer 547 and the electrode 548 are formed in a region that is different from a region in which an antenna 550 is to be formed later.

Other light-transmitting conductive oxide materials such as indium tin oxide (ITO), zinc oxide (ZnO), indium zinc oxide (IZO) and gallium-doped zinc oxide (GZO) can be used as the anode. Further, the anode may be formed by using indium tin oxide including ITO and silicon oxide (hereinafter, ITSO), and indium oxide including silicon oxide in which zinc oxide (ZnO) is further mixed in the range of 2 to 20%. In addition to the other light-transmitting conductive oxide materials for the anode, for example, a single layer of one or more of TiN, ZrN, Ti, W, Ni, Pt, Cr, Ag and Al; a lamination of a titanium nitride film and a film mainly containing aluminum; a three-layer lamination of a titanium nitride film, a film mainly containing aluminum and a titanium nitride film; and the like can be employed. Note that the anode is formed to have the film thickness sufficient to transmit light (preferably, about 5 nm to 30 nm) when light is extracted from the anode side in using a material other than the light-transmitting conductive oxide materials.

The cathode can be formed of a metal, an alloy, a conductive compound, or a mixture of these materials each having low work function. Specifically, the cathode can be formed of an alkali metal such as Li or Cs; an alkali-earth metal such as Ca, Sr, or Mg; an alloy including these (such as Mg:Ag, Al:Li, or Mg:In); a compound of these (such as $CaF_2$ or CaN); or a rare-earth metal such as Yb or Er. When an electron-injecting layer is provided, another conductive layer such as Al can be used. When the light is emitted from the cathode side, the cathode can be formed of another light-transmitting conductive oxide material such as the indium tin oxide (ITO), zinc oxide (ZnO), indium zinc oxide (IZO), or gallium-doped zinc oxide (GZO). Moreover, the cathode may be formed of indium tin oxide including ITO and silicon oxide (ITSO), or indium oxide including silicon oxide in which zinc oxide (ZnO) is further mixed in the range of 2 to 20%. In the case of using such light-transmitting conductive oxide materials, the electron-injecting layer is preferably provided in the electroluminescent layer 547. By forming the cathode to be thick enough to transmit light (preferably from approximately from 5 nm to 30 nm) without using the light-transmitting conductive oxide material, the light can be extracted from the cathode side. In this case, the sheet resistance of the cathode may be suppressed by forming a light-transmitting conductive film to contact the upper part or the lower part of the cathode by using the light-transmitting conductive oxide material.

The second interlayer insulating film 534 is formed from silicon nitride or silicon nitride oxide. A wiring 541 to be in contact with the second interlayer insulating film 534 is formed by using a conductive film including a light transmitting conductive oxide material and silicon oxide such as ITSO. Thus, the luminance of the light-emitting element 549 can be enhanced more than any material combination of the wiring 541 and the second interlayer insulating film 534. Note that the above described vacuum baking is extremely effective for the case where ITSO is used as the wiring 541 since water is easily attached by silicon oxide included therein.

The wiring 541, the electroluminescent layer 547 and the electrode 548 are overlapped in the opening portion of the bank 546 to form a light-emitting element 549.

The light from the light-emitting element 549 may be extracted from the wiring 541 side, from the electrode 548 side, or from the opposite sides. The material and thickness of each anode and cathode are selected from the three structures depending on an intended structure.

A method for manufacturing of an antenna 550 is described next. The antenna 550 may be formed simultaneously in forming the electrode 548 of the light-emitting element 549 by pattering a conductive film or may be formed by another manufacturing method. This embodiment mode shows an example of forming the antenna 550 by a method different from the manufacturing method of the electrode 548.

As shown in FIG. 9B, the antenna 550 is formed on the bank 546. The antenna 550 can be formed of a conductive material containing one or more metals such as Ag, Au, Cu, Pd, Cr, Mo, Ti, Ta, W, Al, Fe, Co, Zn, Sn and Ni, or metal compounds thereof. The antenna 550 is connected to the wiring 535. Although the antenna 550 is directly connected to the wiring 535 in FIG. 9B, the ID chip of the present invention is not limited to this structure. For example, the antenna 550 and the wiring 535 may be electrically connected to each other by using a wiring that is separately formed.

The antenna 550 can be formed by a printing method, a photolithography, a vapor deposition, a droplet discharging method or the like. Although the antenna 550 is formed using a single-layer conductive film in the embodiment mode, it may be formed by laminating plural conductive films. For example, a wiring formed by using Ni or the like is coated with Cu by electroless plating to form the antenna 550.

By using a printing method or a droplet discharging method, the antenna 550 can be formed without using a mask for light-exposure. Differing from the photolithography in which loss of materials is caused by etching, the droplet discharging method and the printing method can utilize materials efficiently. In addition, the manufacturing cost of ID chips can be reduced since an expensive mask for light-exposure is not required.

When using the droplet discharging method or the various kinds of printing methods, for example, a conductive particle obtained by coating Cu with Ag can also be used. In the case where the antenna 550 is formed by a droplet discharging method, the surface of the bank 546 is desirably exposed to a treatment for increasing the adhesion of the antenna 550.

In order to increase the adhesion, for example, the following methods can be cited: a metal or a metal compound that can improve the adhesion of a conductive film or an insulating film due to catalytic action is attached to the surface of the bank 546; an organic insulating film, a metal, and a metal compound each of which is well-adhered to a conductive film or an insulating film to be formed are attached to the surface of the bank 546; and the surface of the bank 546 is subjected to plasma processing under atmospheric pressure or reduced pressure to change the properties of the surface thereof. As the metal, which is well-adhered to the conductive film or the insulating film, titanium, titanium oxide, 3d transition elements such as Sc, Ti, V, Cr, Mn, Fe, Co, Ni, Cu, Zn and the like can be cited. As the metal compound, oxide, nitride, oxynitride and the like of the above-mentioned metals can be cited. As the above-described organic insulating film, polyimide, siloxane resin and the like are cited as examples.

When the metal or the metal compound to be attached to the bank 546 has conductivity, the sheet resistance is controlled so as not to hinder the normal operation of the antenna. Specifically, the average thickness of the metal or metal compound having conductivity may be controlled to be, for example, 1 to 10 nm. The metal or the metal compound may be partly or entirely oxidized to be insulated. Alternatively, in a region other than a region in which the adhesion is intended to be improved, the attached metal or metal compound may be selectively removed by etching. The metal or the metal compound may be selectively attached to a certain region by the droplet discharging method, the printing method, the sol-gel method, etc. rather than attaching it in advance onto the entire surface of the substrate. It is not necessary for the metal or the metal compound to have a completely continuous shape like a film on the surface of the bank 546 and may be dispersed to some extent.

A protective film may be formed to cover the light-emitting element 549 or the antenna 550 after forming the light-emitting element 549 and the antenna 550. A film that prevents a material such as water or oxygen, which are causes of deterioration of a light emitting element from penetrating more than other insulating films is used for the protective film. Typically, a DLC film, a carbon nitride film, a silicon nitride film formed by an RF sputtering or a CVD method, or the like is preferably used. A film in which a carbon nitride film and a silicon nitride film are laminated, a film in which polystyrene is laminated, or the like may be used for the protective film. In addition, it is possible to use a laminated layer of the film that prevents water or oxygen from penetrating and a film that transmits more water or oxygen than the above described film but is low in internal stress as the protective film. A silicon nitride is employed in this embodiment mode. When a silicon nitride film is used as the protective film, a rare gas element such as Ar may be contained in a reaction gas and may be mixed into the protective film to form a fine protective film with a low deposition temperature.

As shown in FIG. 9C, an adhesive agent 551 is applied over the bank 546 to cover the light-emitting element 549 and the antenna 550, then the cover material 552 is attached thereto. The cover material 552 can be formed using the same material as the second substrate 545. The thickness of the adhesive agent 551 may be e.g., 10 to 200 μm.

A material that can attach the cover material 552 and both of the bank 546 and the antenna 550 to one another is used for the adhesive agent 551. As the adhesive agent 551, for example, various types of curing adhesive agents including a reactive curing adhesive agent, a thermal curing adhesive agent, a light curing adhesive agent such as an ultraviolet curing adhesive agent, an anaerobic curing adhesive agent and the like can be used.

Through the above described steps, an ID chip is completed. By the manufacturing method, an extremely thin integrated circuit that is 0.3 μm to 3 μm typically, 2 μm in total thickness can be formed between the second substrate 545 and the cover material 552. The thickness of the integrated circuit includes various insulating films and interlayer insulating films formed between the adhesive agent 544 and the adhesive agent 551, in addition to the thickness of the semiconductor element itself. The area of the integrated circuit included in an ID chip can be 5 mm×5 mm (25 mm square) or less, preferably, about 0.3 mm×0.3 mm (0.09 mm square) to 4 mm×4 mm (16 mm square).

The mechanical strength of an ID chip can be enhanced by locating the integrated circuit in a position closer to the center between the second substrate 545 and the cover material 552. Specifically, when the distance between the second substrate 545 and the cover material 552 is d, it is preferable to control the thickness of the adhesive agents 544 and 551 so that the distance x between the center O in the thickness direction of the integrated circuit and the second substrate 545 can fulfill formula 1 shown below.

Formula 1

$$\frac{1}{2}d - 30 \ \mu m < x < \frac{1}{2}d + 30 \ \mu m \qquad \text{Formula 1}$$

More preferably, the thickness of the adhesive agents 544 and 551 are controlled to fulfill formula 2 as shown below.

Formula 2

$$\frac{1}{2}d - 10 \ \mu m < x < \frac{1}{2}d + 10 \ \mu m \qquad \text{Formula 2}$$

Figure 10:
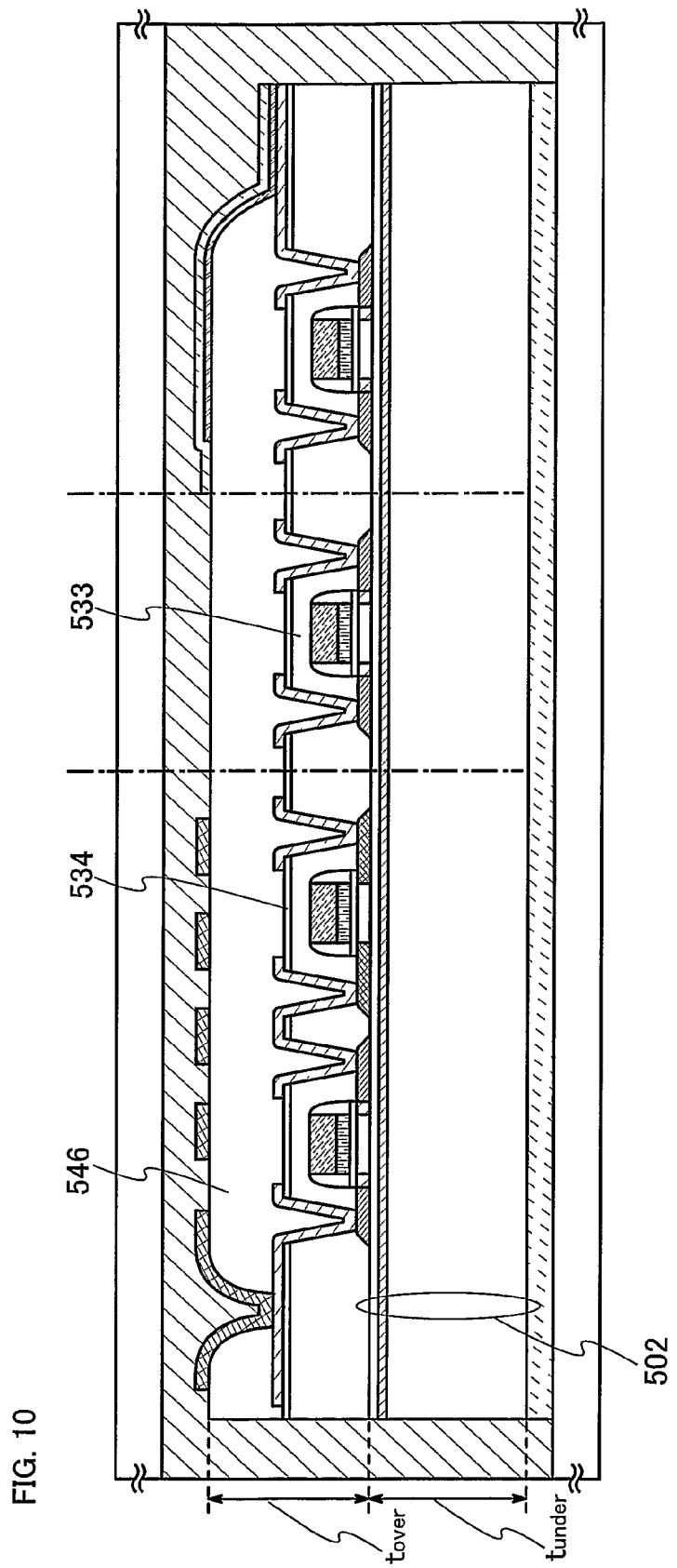
FIG. 10 shows a cross-section of an ED chip according to one aspect of the present invention.

As shown in FIG. 10, the thickness of the base film 502, the first interlayer insulating film 533, the second interlayer insulating film 534 or the bank 546 may be adjusted so that the distance $t_{under}$, between the island-like semiconductor film of the TFT and the base film of the lower part, and the distance $t_{over}$, between the island-like semiconductor film and the bank 546, in the integrated circuit are equal or almost equal. By locating the island-like semiconductor film in the center of the integrated circuit, the stress applied on the semiconductor layer can be released and generation of cracks can be prevented.

In FIG. 9C, an example of employing the cover material 552 is shown, but the present invention is not limited to this structure. For example, the step shown in FIG. 9B may be the last step or a layer for protecting the antenna 550 and the light-emitting element 549 may be formed after the step shown in FIG. 9B, thereby completing the integrated circuit.

The method for separating the integrated circuit from the substrate by providing the separation layer between the first substrate 500 that is high heat resistant and the integrated circuit and removing the separation layer by etching is shown in the embodiment mode, however, the method for manufacturing an ID chip according to the present invention is not limited thereto. For example, a metal oxide film may be provided between the high heat resistant substrate and the integrated circuit and the metal oxide film may be crystallized to be weakened so that the integrated circuit is separated from the substrate. Alternatively, a separation layer made from an amorphous semiconductor film containing hydrogen may be provided between the high heat resistant substrate and the integrated circuit and the separation layer may be removed by laser irradiation so that the integrated circuit may be separated from the substrate. Alternatively, the high heat resistant substrate over which the integrated circuit is formed may be mechanically eliminated or removed by etching using a solution or a gas so that the integrated circuit may be separated from the substrate.

When organic resin is used as the adhesive agent 544 in contact with the base film 502, to ensure the flexibility of the ID chip, it is possible to prevent an alkaline metal such as Na or an alkaline earth metal from spreading into the semiconductor film from the organic resin by using a silicon nitride film or a silicon nitride oxide film as the base film 502.

When an ID chip is attached to an object having a curved surface, which is created by a bus bar on a conical surface, a cylindrical surface or the like, and the second substrate 545 of the ID chip is also curved, it is preferable that the direction of the bus bar is the same as a movement direction of carriers of the TFTs 529 to 532. According to the structure, adverse affects due to bending of the second substrate 545 to the characteristics of the TFTs 529 to 532 can be prevented. The percentage of area in the integrated circuit occupied by the island-like semiconductor film is set 1 to 30%, thereby suppressing adverse affects to the characteristics of the TFTs 529 to 532 even when the second substrate 545 is bent.

This embodiment mode describes the example in which the antenna and the integrated circuit are formed on the same substrate. However, the present invention is not limited to this structure. An antenna formed on a substrate may be attached to an integrated circuit formed on another substrate to electrically connect with each other. In this embodiment mode, the example of forming both the antenna 550 and the light-emitting element 549 over the bank 546 is shown. However, the present invention is not limited to this structure and the antenna 550 and the light-emitting element 549 may be formed over different layers.

In general, ID chips in many cases use radio waves with a frequency of 13.56 MHz or 2.45 GHz. Therefore, it is extremely important for expanding the versatility of ID chips that an ID chip is formed so that radio waves of these frequencies can be detected.

The ID chip of this embodiment mode has the advantage that radio waves are less shielded therein as compared with in an ID chip formed by using a semiconductor substrate, and thus signal attenuation due to shielded radio waves can be prevented. Therefore, since a semiconductor substrate is not needed, the cost of the ID chip can be drastically reduced. For example, the case of using a silicon substrate with a diameter of 12 inches is compared with the case of using a glass substrate with a size of 730×920 mm². The silicon substrate has an area of about 73000 mm² whereas the glass substrate has an area of about 672000 mm², that is, the glass substrate is about 9.2 times larger than the silicon substrate. On the glass substrate with an area of about 672000 mm², about 672000 ID chips each having an area of 1 mm square can be formed when margin for cutting the substrate is not taken into account, which is about 9.2 times more than the ID chips formed on the silicon substrate. In the case of using the glass substrate with a size of 730×920 mm², which requires fewer manufacturing steps, facility investment cost for mass production of ID chips can be reduced by one-third of the case in which the silicon substrate with a diameter of 12 inches is used. Further, according to the present invention, after an integrated circuit is separated from a glass substrate, the glass substrate can be reused. Therefore, in the case of using the glass substrate, the cost can be significantly reduced when compared to the case of using the silicon substrate, even when the cost of compensating for a broken glass substrate or cleaning a surface of the glass substrate is taken into account. Even if a glass substrate is not reused and discarded, a glass substrate with a size of 730×920 mm² costs about half as much as a silicon substrate with a diameter of 12 inches. As a result, it is apparent that the cost of an ID chip can be reduced drastically.

Thus, an ID chip using a glass substrate with a size of 730×920 mm² costs about only one-thirtieth as much as an ID chip using a silicon substrate with a diameter of 12 inches. Since the ID chip is expected to be used as a disposable one, the ID chip of the present invention, which can cost much less, is quite effective for such an application.

In this embodiment mode, the example in which the integrated circuit is separated and attached to a flexible substrate is shown. However, the present invention is not limited to this structure. For example, an integrated circuit is not necessarily separated if a heat resistant substrate such as a glass substrate, which can resist a heat treatment during the manufacturing steps of the integrated circuit, is used.

In addition, the IC card of the present invention can be formed as referred to in the above manufacturing method. Note that when the IC card has a display device, the display device may be formed separately from the integrated circuit and attached to the second substrate or the display device may be formed with the integrated circuit and attached to the second substrate.

Embodiment 1

Embodiment 1 describes a structure of an ID chip in which an antenna and an integrated circuit, each formed over different substrates, are electrically connected to each other, which is different from Embodiment Modes.

As shown in FIG. 11A, a bank 1200 having an opening portion is formed and parts of each wiring 1201 and 1202 are exposed in the opening portion in the ID chip of this embodiment.

An adhesive agent 1207 is formed over the bank 1200 to cover a terminal 1203, and a cover material 1208 is attached to the bank 1200 by the adhesive agent 1207. Anisotropic conductive resin can be used for the adhesive agent 1207.

An antenna 1209 is formed in advance on the cover material 1208. The antenna 1209 is formed on the side opposite to the bank 1200 of the cover material 1208. A portion of the antenna 1209 is exposed on the terminal 1203 side through a contact hole formed in the cover material 1208. Note that the antenna 1209 may be formed on the bank 1200 side of the cover material 1208. The antenna 1209 and the terminal 1203 can be electrically connected by using anisotropic conductive resin as the adhesive agent 1207.

The anisotropic conductive resin is a material in which a conductive material is dispersed in a resin. The following examples can be used as the resin: a thermal curing resin such as an epoxy resin, a urethane resin, and an acrylic resin; a thermoplastic resin such as a polyethylene resin and a polypropylene resin; a siloxane resin; and the like. As the conductive material, for example, a plastic particle such as polystyrene and epoxy that is plated by Ni, Au or the like; a metal particle such as Ni, Au, Ag, solder; particulate or fibrous carbon, fibrous Ni plated by Au; and the like can be used. The size of the conductive material is desirably determined in accordance with the distance between the antenna 1209 and the terminal 1203.

The antenna 1209 and the terminal 1203 may be pressure-bonded to each other by applying ultrasonic waves to the anisotropic conductive resin, or pressure bonded to each other by curing the anisotropic conductive resin using irradiation with ultraviolet light.

Although this embodiment shows the example of electrically connecting the antenna 1209 and the terminal 1203 with the adhesive agent 1207 made from the anisotropic conductive resin, the present invention is not limited to the structure. The antenna 1209 and the terminal 1203 may be electrically connected by pressure bonding an anisotropic conductive film as the substitute for the adhesive agent 1207.

Although the embodiment shows the example in which the integrated circuit is separated and then attached to the flexible substrate, the present invention is not limited to the structure. For example, when using a substrate that can withstand a heat treatment such as a glass substrate in the process of manufacturing the integrated circuit, the integrated circuit is not necessarily separated. FIG. 11B is a cross sectional view showing one mode of the ID chip that is formed by using a glass substrate.

In the ID chip shown in FIG. 11B, a glass substrate is used as the substrate 1210. No adhesive agent is sandwiched between semiconductor elements 1211 to 1214 used for an integrated circuit and the substrate 1210, and as the result thereof, the substrate 1210 and the base film 1215 are formed to be in contact with each other. In the structure, there is no possibility that the alkali metal such as Na, alkali earth metal, water and the like penetrate into a semiconductor film included in the semiconductor elements 1211 to 1214.

Embodiment 2

Embodiment 2 describes an example of a photodiode used in an ID chip or an IC card of the present invention.

FIG. 12A shows a cross-section of an ID chip or an IC card of this embodiment. In FIG. 12A, a photodiode 1500 is formed over the second interlayer insulating film 1501, and a TFT 1502 for controlling drive of the photodiode 1500 is covered by the first interlayer insulating film 1503 and the second interlayer insulating film 1501. Although the TFT 1502 is covered by two interlayer insulating films, that is, the first interlayer insulating film 1503 and the second interlayer insulating film 1501, this embodiment is not limited to this structure. The TFT 1502 may also be covered by a single layer of an interlayer insulating film or three or more layers of interlayer insulating films.

The photodiode 1500 includes a cathode 1504 formed over the second interlayer insulating film 1501, a photoelectric conversion layer 1505 formed over the cathode 1504 which conducts photoelectric conversion, and an anode 1506 formed over the photoelectric conversion layer 1505. Specifically, the cathode 1504 can be formed of an alkali metal such as Li or Cs; an alkali-earth metal such as Ca, Sr, or Mg; an alloy including these (such as Mg:Ag, Al:Li, or Mg:In); a chemical compound of these (such as $CaF_2$ or CaN); or a rare-earth metal such as Yb or Er, for example. The photoelectric conversion layer 1505 can be formed by using e.g., an amorphous silicon film containing hydrogen. In addition, the anode 1506 may be formed of a light-transmitting conductive oxide material such as the indium tin oxide (ITO), zinc oxide (ZnO), indium zinc oxide (IZO), or gallium-doped zinc oxide (GZO). Moreover, the anode may be formed of indium tin oxide including ITO and silicon oxide (ITSO), or indium oxide including silicon oxide in which zinc oxide (ZnO) is further mixed in the range of 2 to 20%.

Note that the cathode 1504, the photoelectric conversion layer 1505 and the anode 1506 each may have a single layer structure or a laminated structure.

As shown in FIG. 12B, a shielding film 1513 for shielding light is provided on the side opposite to the substrate 1510 with respect to the photodiode 1511. Thus, the direction of light that enters the photodiode 1511 can be limited. A metal film, a resin added with a pigment, or the like that can shield light can be used for the shielding film 1513.

In FIG. 12B, light emitted from the light-emitting element 1512 is directed toward the side opposite to the substrate and the shielding film 1513 is formed so that light from the substrate 1510 side enters the photodiode 1511 preferentially. However, the present embodiment is not limited to this structure. The position for forming the shielding film 1513 is not limited to the position shown in FIG. 12B. In addition, as for the direction of the light emitted from the light-emitting element 1512, light may be emitted toward the substrate 1510 without being limited to the structure shown in FIG. 12B.

Note that the shielding film 1513 can be formed even if a photodiode having the structure shown in Embodiment Modes is used.

The photodiode used in an ID chip or an IC card of the present invention is not limited to the structure of this embodiment.

This embodiment can be combined with Embodiment 1.

Embodiment 3

A structure of an ID chip or an IC card in the case of forming a wiring connected to a TFT and an antenna together by patterning one conductive film will be explained with reference to FIG. 13A. FIG. 13A is a cross sectional view of the ID chip or the IC card according to this embodiment.

In FIG. 13A, reference numeral 1401 denotes a TFT for controlling the operation of a light-emitting element 1409. The TFT 1401 includes an island-like semiconductor film 1402, a gate insulating film 1403 in contact with the island-like semiconductor film 1402 and a gate electrode 1404 that overlaps the island-like semiconductor film 1402 with the gate insulating film 1403 interposed therebetween. The TFT 1401 is covered with a first interlayer insulating film 1405 and a second interlayer insulating film 1406. In this embodiment, the TFT 1401 is covered with two interlayer insulating films, that is, the first interlayer insulating film 1405 and the second interlayer insulating film 1406. However, this embodiment is not limited to this structure. The TFT 1401 may be covered with a single layer or three or more layers of interlayer insulating films.

A wiring 1407 formed on the second interlayer insulating film 1406 is connected to the island-like semiconductor film 1402 through a contact hole formed in the first interlayer insulating film 1405 and the second interlayer insulating film 1406.

An antenna 1408 is formed over the second interlayer insulating film 1406. A conductive film is formed over the second interlayer insulating film 1406 and patterned to form the wiring 1407 and the antenna 1408. By forming the antenna 1408 along with the wiring 1407, the number of steps for manufacturing the ID chip or IC card can be reduced.

Next, a structure of an ID chip or an IC card in the case of forming a gate electrode of a TFT and an antenna by patterning one conductive film will be explained with reference to FIG. 13B. FIG. 13B is a cross sectional view of the ID chip or the IC card according to this embodiment.

In FIG. 13B, reference numeral 1411 denotes a TFT for controlling the operation of a light-emitting element 1419. The TFT 1411 includes an island-like semiconductor film 1412, a gate insulating film 1413 overlapping the island-like semiconductor film 1412, and a gate electrode 1414 that overlaps the island-like semiconductor film 1412 with the gate insulating film 1413 interposed therebetween. An antenna 1418 is formed over the gate insulating film 1413. A conductive film is formed over the gate insulating film 1413 and patterned to form the gate electrode 1414 and the antenna 1418. By forming the antenna 1418 along with the gate electrode 1414, the number of steps for manufacturing the ID chip or IC card can be reduced.

In this embodiment mode, the example in which the integrated circuit is separated and attached to a substrate that is prepared separately is shown. However, the present invention is not limited to this structure. For example, an integrated circuit is not necessarily separated if a heat resistant substrate that can resist a heat treatment in the manufacturing steps of the integrated circuit, such as a glass substrate, is used.

Embodiment 4

Figure 14A:
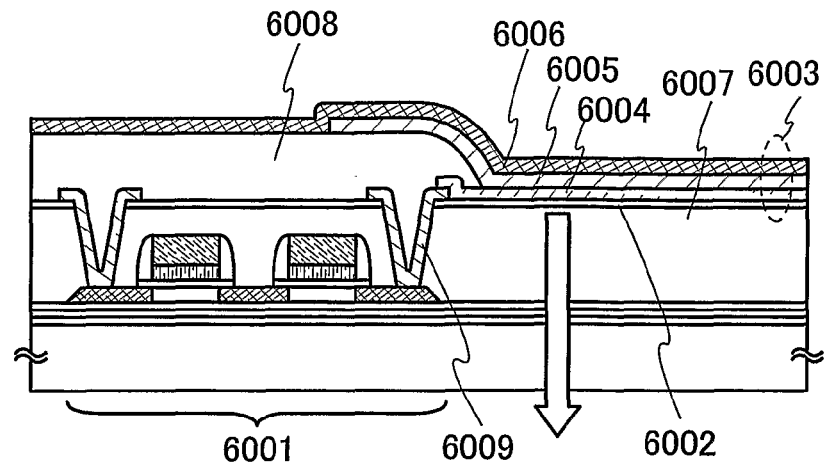
FIGS. 14A to 14C each show a cross-section of a light-emitting element of an ID chip or an IC card according to one aspect of the present invention.
Figure 14B:
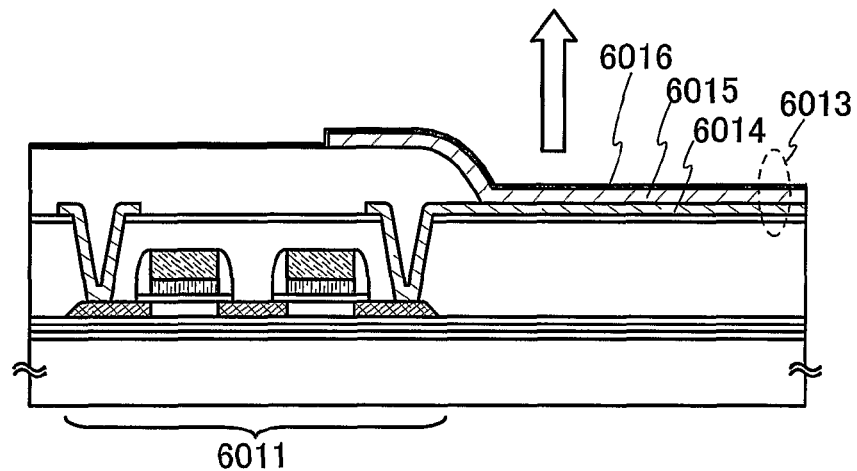
Figure 14C:
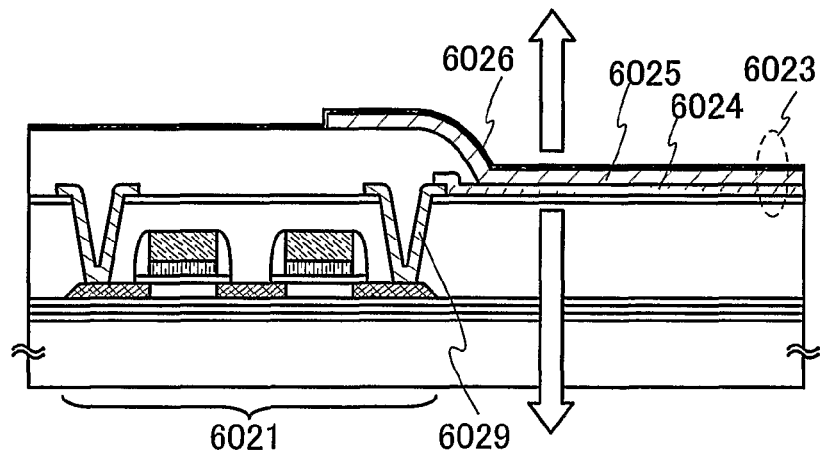

Embodiment 4 describes a cross-sectional structure of a pixel in the case that a TFT controlling the operation of a light-emitting element is p-type with reference to FIGS. 14A to 14C. Note that, in FIGS. 14A to 14C, one (a first electrode) of two electrodes included in the light-emitting element, which is directly or electrically connected to a TFT, is an anode, and the other electrode (a second electrode) thereof is a cathode, but the first electrode may be a cathode and the second electrode may be an anode.

FIG. 14A shows a cross-sectional view of a pixel in the case that a TFT 6001 is p-type, and light emitted from a light-emitting element 6003 is extracted from a first electrode 6004 side. In FIG. 14A, the first electrode 6004 of the light-emitting element 6003 is electrically connected to the TFT 6001 through a wiring 6009. However, the present invention is not limited to this structure. A part of the wiring 6009 that is directly connected to the TFT 6001 may be used as the first electrode 6004.

The TFT 6001 is covered with a first interlayer insulating film 6007 and a second interlayer insulating film 6002. Although in FIG. 14A, the TFT 6001 is covered by two interlayer insulating films, that is, the first interlayer insulating film 6007 and the second interlayer insulating film 6002, the present invention is not limited to this structure. The TFT 6001 may be covered with a single layer of interlayer insulating film, or three or more layers of interlayer insulating films.

A bank 6008 having an opening portion is formed over the second interlayer insulating film 6002. A portion of the first electrode 6004 is exposed in the opening portion of the bank 6008, and the first electrode 6004, an electroluminescent layer 6005 and a second electrode 6006 are stacked sequentially.

In FIG. 14A, the first electrode 6004 is an anode, and the second electrode 6006 is a cathode. Materials suitable for each the anode and the cathode can be referred to in Embodiment Modes. Note that the first electrode 6004 is formed by using a material or a thickness that can transmit light. The second electrode 6006 is formed by using a material or a thickness that can reflect or shield light.

The electroluminescent layer 6005 is formed to have a single or a plurality of layers. In the case of a structure of plural layers, the following layers in terms of carrier transporting properties may be classified as a hole injecting layer, a hole transporting layer, a light emitting layer, an electron transporting layer, an electron injecting layer and the like. The hole injecting layer, the hole transporting layer, the light emitting layer, the electron transporting layer and the electron injecting layer are stacked in this order on the first electrode 6004, when the electroluminescent layer 6005 has, in addition to the light emitting layer, any of the following: the hole injecting layer, the hole transporting layer, the electron transporting layer and the electron injecting layer. Note that the boundary of each layer is not necessarily distinct and the boundary can not be distinguished clearly in some cases since the materials forming the respective layers are partially mixed into the adjacent layers. Each of the layers may be formed of an organic material or an inorganic material. As for the organic material, any one of a high molecular weight material, a medium molecular weight material and a low molecular weight material can be employed. Note that the medium molecular weight material means a low polymer in which the number of repeated structural units (the degree of polymerization) is about 2 to 20. There is no clear distinction between the hole injecting layer and the hole transporting layer, and both of them inevitably have a hole transporting property (hole mobility). The hole injecting layer is in contact with the anode, and the layer in contact with the hole injecting layer is distinguished as the hole transporting layer for convenience. The same applies to the electron transporting layer and the electron injecting layer. A layer in contact with the cathode is called the electron injecting layer while a layer in contact with the electron injecting layer is called the electron transporting layer. The light emitting layer may have the function of the electron transporting layer in some cases, and it is therefore called a light emitting electron transporting layer.

In the case of the pixel shown in FIG. 14A, light emitted from the light emitting element 6003 can be extracted from the first electrode 6004 side as shown by the outlined arrow.

FIG. 14B illustrates a cross-sectional view of a pixel in the case where a TFT 6011 is p-type and light emitted from a light emitting element 6013 is extracted from a second electrode 6016 side. In FIG. 14B, a portion of a wiring that is directly connected to the TFT 6011 is used as a first electrode 6014. However, the present invention is not limited to this structure. The first electrode 6014 of the light-emitting element 6013 may be electrically connected to the TFT 6011 through a wiring formed separately.

An electroluminescent layer 6015 and the second electrode 6016 are stacked sequentially over the first electrode 6014. In FIG. 14B, the first electrode 6014 is an anode and the second electrode 6016 is a cathode. Materials suitable for each the anode and the cathode can be referred to in Embodiment Modes. Note that the first electrode 6014 is formed by using a material or a thickness that can reflect or shield light. The second electrode 6016 is formed by using a material or a thickness that can transmit light.

The electroluminescent layer 6015 can be formed in the same way as the electroluminescent layer 6005 shown in FIG. 14A. In the case of the pixel shown in FIG. 14B, light emitted from the light emitting element 6013 can be extracted from the second electrode 6016 side as shown by the outlined arrow.

FIG. 14C illustrates a cross-sectional view of a pixel in the case where a TFT 6021 is p-type, and light emitted from a light emitting element 6023 is extracted from opposite sides of a first electrode 6024 and a second electrode 6026. Although FIG. 14C illustrates the structure in which the first electrode 6024 of the light emitting element 6023 is electrically connected to the TFT 6021 through a wiring 6029, the present invention is not limited to this structure. A part of the wiring 6029 that is directly connected to the TFT 6021 may be used as the first electrode 6024.

An electroluminescent layer 6025 and the second electrode 6026 are stacked sequentially over the first electrode 6024. In FIG. 14C, the first electrode 6024 is an anode and the second electrode 6026 is a cathode. Materials suitable for each the anode and the cathode can be referred to in Embodiment Modes. Note that the first electrode 6024 and the second electrode 6026 are each formed by using a material or a thickness that can transmit light.

The electroluminescent layer 6025 can be formed in the same way as the electroluminescent layer 6005 shown in FIG. 14A. In the case of the pixel shown in FIG. 14C, light emitted from the light emitting element 6023 can be extracted from opposite sides of the first electrode 6024 and the second electrode 6026 as shown by the outlined arrows.

In this embodiment, the TFTs 6001, 6011 and 6021 each have a structure having two gate electrodes (a double gate structure) in which two TFTs are connected serially. However, this embodiment is not limited to this structure. A single gate structure including one gate electrode or a multi-gate structure having three or more gate electrodes in which three or more TFTs are connected serially may be employed.

Embodiment 5

Figure 15A:
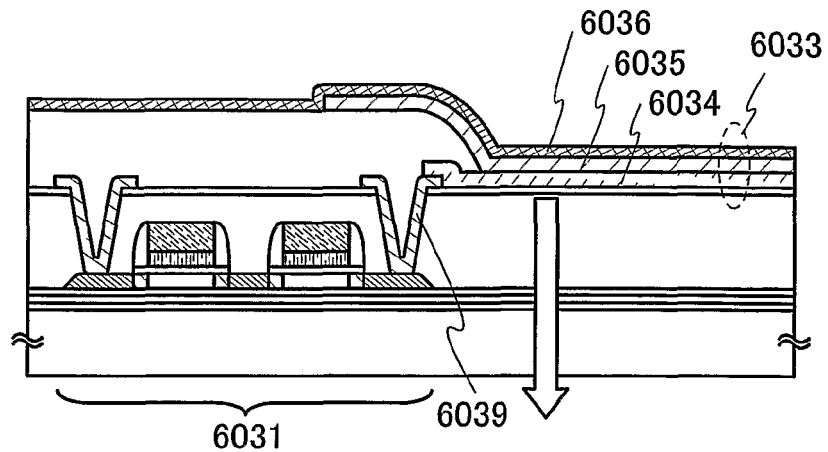
FIGS. 15A to 15C are each a cross-section of a light-emitting element of an ID chip or an IC card according to one aspect of the present invention.
Figure 15B:
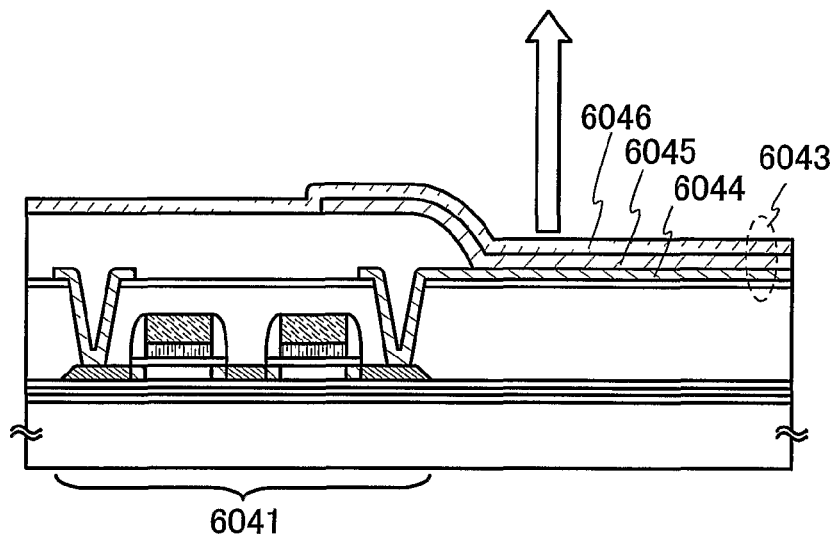
Figure 15C:
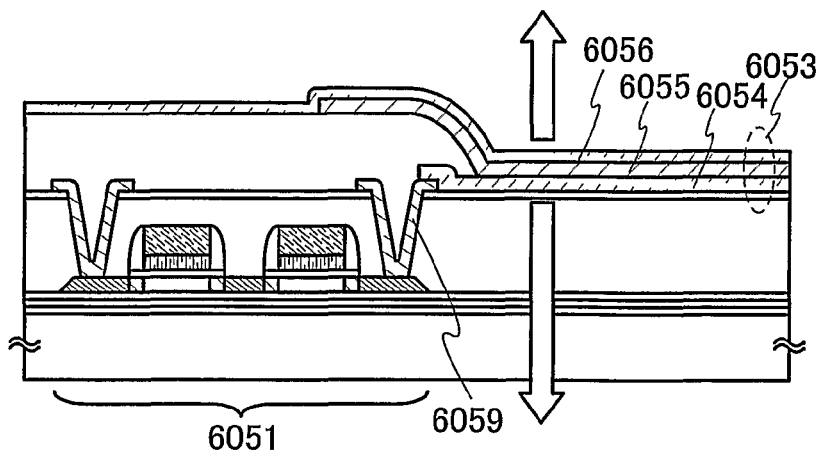

Embodiment 5 describes a cross-sectional structure of a pixel when a TFT controlling the operation of a light-emitting element is n-type, with reference to FIGS. 15A to 15C. Note that regarding two electrodes of the light-emitting element, the case where one electrode (a first electrode) directly or electrically connected to a TFT is a cathode and the other electrode (a second electrode) is an anode, is shown in FIGS. 15A to 15C, but the first electrode may be an anode and the second electrode may be a cathode.

FIG. 15A chows a cross-sectional view of a pixel when a TFT 6031 is n-type, and light emitted from a light-emitting element 6033 is extracted from a first electrode 6034 side. In FIG. 15A, the first electrode 6034 of the light-emitting element 6033 is electrically connected to the TFT 6031 through a wiring 6039. However, the present invention is not limited to this structure. A part of the wiring 6039 that is directly connected to the TFT 6031 may be used as the first electrode 6034.

An electroluminescent layer 6035 and a second electrode 6036 are stacked sequentially over the first electrode 6034. In FIG. 15A, the first electrode 6034 is a cathode and the second electrode 6036 is an anode. Materials suitable for each the anode and the cathode can be referred to in Embodiment Modes. Note that the first electrode 6034 is formed by using a material or a thickness that can transmit light. The second electrode 6036 is formed by using a material or a thickness that can shield or reflect light.

The electroluminescent layer 6035 can be formed in the same way as the electroluminescent layer 6005 shown in FIG. 14A. Note that an electron injecting layer, an electron transporting layer, a light-emitting layer, a hole transporting layer and a hole injecting layer are laminated in this order over the first electrode 6034, if the electroluminescent layer 6035 includes any of the following: a hole injecting layer, a hole transporting layer, an electron transporting layer and an electron injecting layer in addition to a light-emitting element.

In the case of the pixel shown in FIG. 15A, light emitted from the light emitting element 6033 can be extracted from the first electrode 6034 side as shown by the outlined arrow.

FIG. 15B illustrates a cross-sectional view of a pixel in the case where a TFT 6041 is n-type and light emitted from a light emitting element 6043 is extracted from a second electrode 6046 side. In FIG. 15B, a portion of the wiring that is directly connected to the TFT 6041 is used as a first electrode 6044. However, the present invention is not limited to this structure. The first electrode 6044 of the light-emitting element 6043 may be electrically connected to the TFT 6041 through a wiring formed separately.

An electroluminescent layer 6045 and the second electrode 6046 are stacked sequentially over the first electrode 6044. In FIG. 15B, the first electrode 6044 is a cathode and the second electrode 6046 is an anode. Materials suitable for each the anode and the cathode can be referred to in Embodiment Modes. Note that the first electrode 6044 is formed by using a material or a thickness that can shield or reflect light. The second electrode 6046 is formed by using a material or a thickness that can transmit light.

The electroluminescent layer 6045 can be formed in the same way as the electroluminescent layer 6035 shown in FIG. 15A. In the case of the pixel shown in FIG. 15B, light emitted from the light emitting element 6043 can be extracted from the second electrode 6046 side as shown by the outlined arrow.

FIG. 15C illustrates a cross-sectional view of a pixel in the case where a TFT 6051 is n-type and light emitted from a light emitting element 6053 is extracted from opposite sides of a first electrode 6054 and a second electrode 6056. Although FIG. 15C illustrates a structure in which the first electrode 6054 of the light emitting element 6053 is electrically connected to the TFT 6051 through a wiring 6059, the present invention is not limited to this structure. A part of the wiring 6059 that is directly connected to the TFT 6051 may be used as the first electrode 6054.

An electroluminescent layer 6055 and the second electrode 6056 are stacked sequentially over the first electrode 6054. In FIG. 15C, the first electrode 6054 is a cathode and the second electrode 6056 is an anode. Materials suitable for each the anode and the cathode can be referred to in Embodiment Modes. Note that the first electrode 6054 and the second electrode 6056 are each formed by using a material or a thickness that can transmit light.

The electroluminescent layer 6055 can be formed in the same way as the electroluminescent layer 6035 shown in FIG. 15A. In the case of the pixel shown in FIG. 15C, light emitted from the light emitting element 6053 can be extracted from opposite sides of the first electrode 6054 and the second electrode 6056 as shown by the outlined arrows.

In this embodiment, the TFTs 6031, 6041 and 6051 each have a structure having two gate electrodes (a double gate structure) in which two TFTs are connected serially. However, this embodiment is not limited to this structure. A single gate structure including one gate electrode or a multi-gate structure having three or more gate electrodes in which three or more are connected serially may be employed.

Embodiment 6

Embodiment 6 describes a structure of a TFT used in an ID chip or an IC card of the present invention.

Figure 16A:
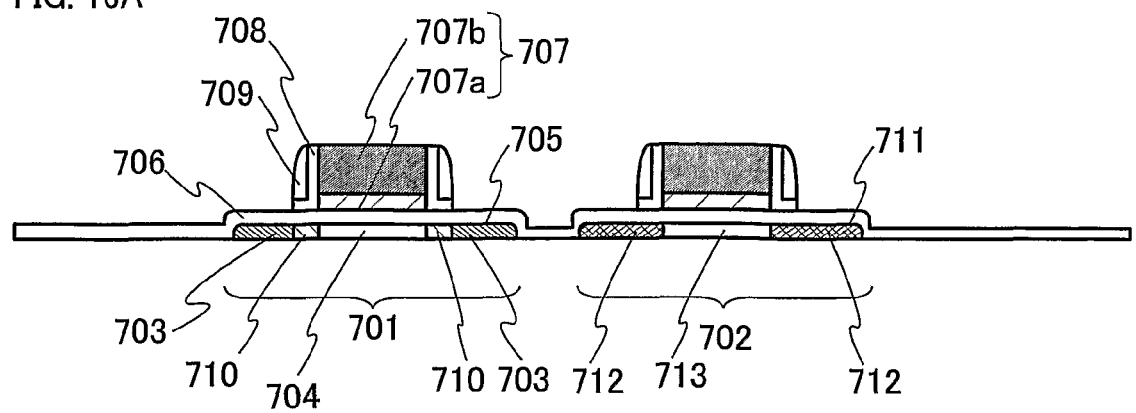
FIGS. 16A to 16C are each a cross-section of a TFT of an ID chip or an IC card according to one aspect of the present invention.

FIG. 16A shows a cross sectional view of TFT according to the embodiment. Reference numeral 701 represents an n-channel TFT; and 702, a p-channel TFT. The configuration of the n-channel TFT 701 will be explained in detail as an example.

The n-channel TFT 701 includes an island-like semiconductor film 705 to be used as an active layer. The island-like semiconductor film 705 includes two impurity regions 703 to be used as a source region and a drain region, a channel formation region 704 sandwiched between the two impurity regions 703, and two LDD (lightly doped drain) regions 710 sandwiched between the impurity regions 703 and the channel formation region 704. The n-channel TFT 701 further includes a gate insulating film 706 covering the island-like semiconductor film 705, a gate electrode 707, and two sidewalls 708 and 709 made from insulating films.

Although the gate electrode 707 includes two conductive films 707a and 707b in this embodiment, the present invention is not limited to this configuration. The gate electrode 707 may include a single-layer conductive film or two or more layer conductive films. The gate electrode 707 overlaps the channel formation region 704 of the island-like semiconductor film 705 with the gate insulating film 706 therebetween. The sidewalls 708 and 709 overlap the two LDD regions 710 of the island-like semiconductor film 705 with the gate insulating layer 706 therebetween.

For example, the sidewalls 708 can be formed by etching a silicon oxide film with a thickness of 100 nm whereas the sidewalls 709 can be formed by etching an LTO film (a low temperature oxide film) with a thickness of 200 nm. In this embodiment, the silicon oxide film used for the sidewalls 708 is formed by a plasma CVD method and the LTO film used for the sidewalls 709 is formed by a low pressure CVD method. Note that although the silicon oxide film may contain nitrogen, the number of nitrogen atoms is to be set lower than that of oxygen atoms.

After doping an n-type impurity to the island-like semiconductor film 705 using the gate electrode 707 as a mask, the sidewalls 708 and 709 are formed, and an n-type impurity element is doped to the island-like semiconductor film 705 utilizing the sidewalls 708 and 709 as masks, so that the impurity regions 703 and the LDD regions 710 can be formed separately.

The p-channel TFT 702 has almost the same configuration as the n-channel TFT 701; however, only a structure of an island-like semiconductor film 711 of the p-channel TFT 702 is different. The island-like semiconductor film 711 does not have an LDD region, but includes two impurity regions 712 and a channel formation region 713 sandwiched between the impurity regions. The impurity regions 712 are doped with a p-type impurity. Although FIG. 16A illustrates an example in which the p-channel TFT 702 does not have an LDD region, the present invention is not limited to this configuration. The p-channel TFT 702 may include an LDD region.

Figure 16B:
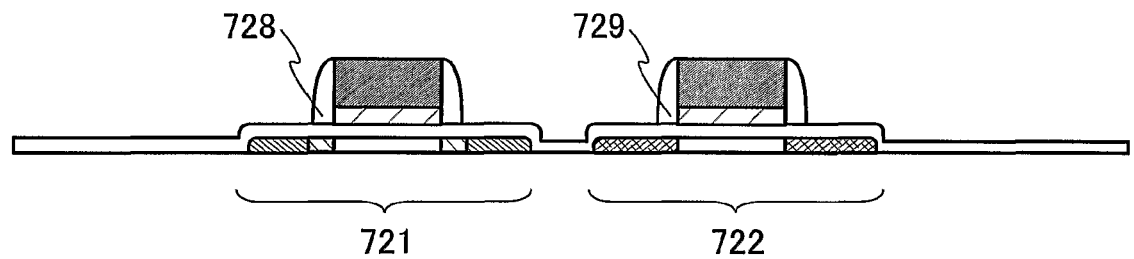

FIG. 16B shows a case where each TFT shown in FIG. 16A has sidewalls with single layer. An n-channel TFT 721 and a p-channel TFT 722 as shown in FIG. 16B each include the sidewalls with single layer 728 and 729, respectively. The sidewalls 728 and 729 can, for example, be made by etching a silicon oxide film with a thickness of 100 nm. In this embodiment, the silicon oxide film used for the sidewall 728 and 729 are formed by a plasma CVD method. The silicon oxide film may contain nitrogen; however, the number of nitrogen atoms is to be set lower than that of oxygen atoms.

Figure 16C:
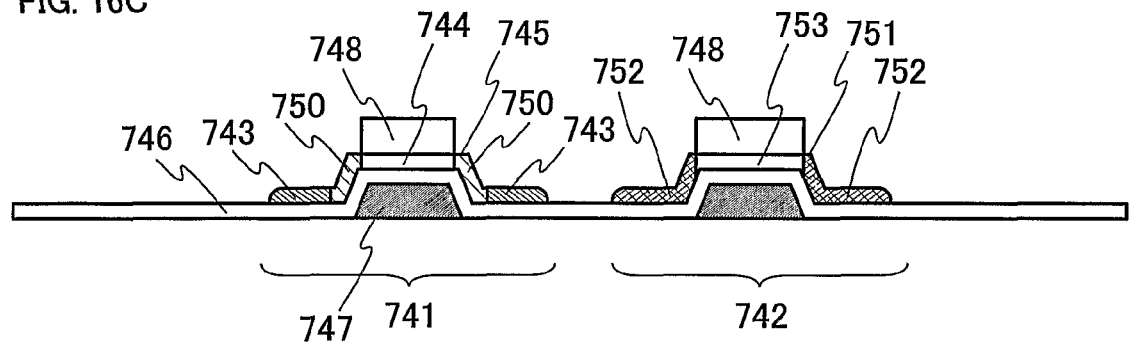

FIG. 16C shows a structure of bottom-gate TFTs. Reference numeral 741 denotes an n-channel TFT; and 742, a p-channel TFT. The n-channel TFT 741 will be explained in detail as an example.

In FIG. 16C, the n-channel TFT 741 includes an island-like semiconductor film 745. The island-like semiconductor film 745 includes two impurity regions 743 used as a source region and a drain region, a channel formation region 744 sandwiched between the impurity regions 743, and two LDD (lightly doped drain) regions 750 sandwiched between the two impurity regions 743 and the channel formation region 744. The n-channel TFT 741 further includes a gate insulating film 746, a gate electrode 747 and a protective film 748 which is made from an insulating film.

The gate electrode 747 overlaps the channel formation region 744 of the island-like semiconductor film 745 with the gate insulating film 746 therebetween. The gate insulating film 746 is formed after forming the gate electrode 747 and the island-like semiconductor film 745 is formed after forming the gate insulating film 746. The protective film 748 overlaps the gate insulating film 746 with the channel formation region 744 therebetween.

The protective film 748, for example, can be formed by etching a silicon oxide film with a thickness of 100 nm. In this embodiment, the silicon oxide film is formed by a plasma CVD method as the protective film 748. Note that the silicon oxide film may contain nitrogen; however, the number of nitrogen atoms is to be set lower than that of oxygen atoms.

After doping an n-type impurity to the island-like semiconductor film 745 utilizing a mask made from a resist, the protective film 748 is formed, and an n-type impurity is doped to the island-like semiconductor film 745 by utilizing the protective film 748 as a mask, so that the impurity regions 743 and the LDD regions 750 can be formed separately.

Although the p-channel TFT 742 has almost the same structure as the n-channel TFT 741, only the structure of the island-like semiconductor film 751 of the p-channel TFT 742 is different. The island-like semiconductor film 751 does not include an LDD region, but includes two impurity regions 752 and a channel formation region 753 sandwiched between the two impurity regions 752. The impurity regions 752 are doped with a p-type impurity. Although FIG. 16C shows the example in which the p-channel TFT 742 does not have an LDD region, the present invention is not limited to the structure. The p-channel TFT 742 may include an LDD region.

This embodiment can be combined freely with Embodiments 1 to 5.

Embodiment 7

In this embodiment, a method for manufacturing plural ID chips or IC cards with the use of a large size substrate will be described.

Figure 17A:
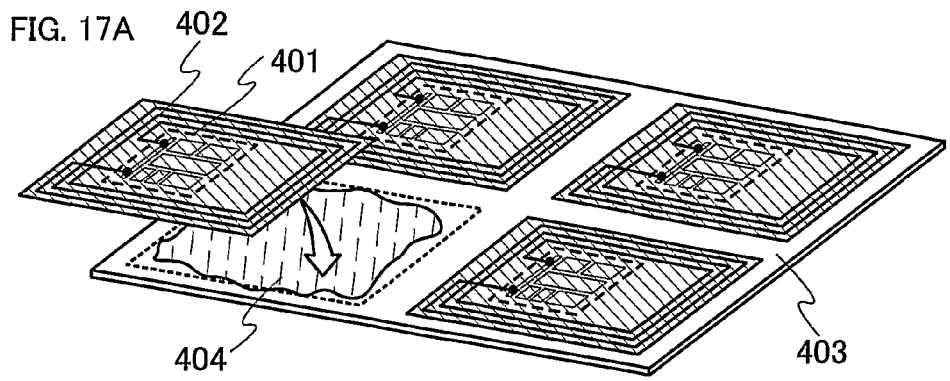
FIGS. 17A to 17D are each a diagram showing a method of manufacturing a plurality of integrated circuits from a large substrate, which are each to be used as an ID chip or an IC card according to one aspect of the present invention.

An integrated circuit 401 and an antenna 402 are formed over a heat resistant substrate. Thereafter, the integrated circuit 401 and the antenna 402 are both separated from the heat resistant substrate and attached to a substrate 403, which has been separately prepared, with an adhesive agent 404 as shown in FIG. 17A. Although FIG. 17A shows a mode in which a set of the integrated circuit 401 and the antenna 402 is attached to the substrate 403, the present invention is not limited to this configuration. Alternatively, plural sets of the integrated circuit 401 and the antenna 402, which are connected to each other, may be separated from the heat resistant substrate and attached onto the substrate 403 at the same time.

Figure 17B:
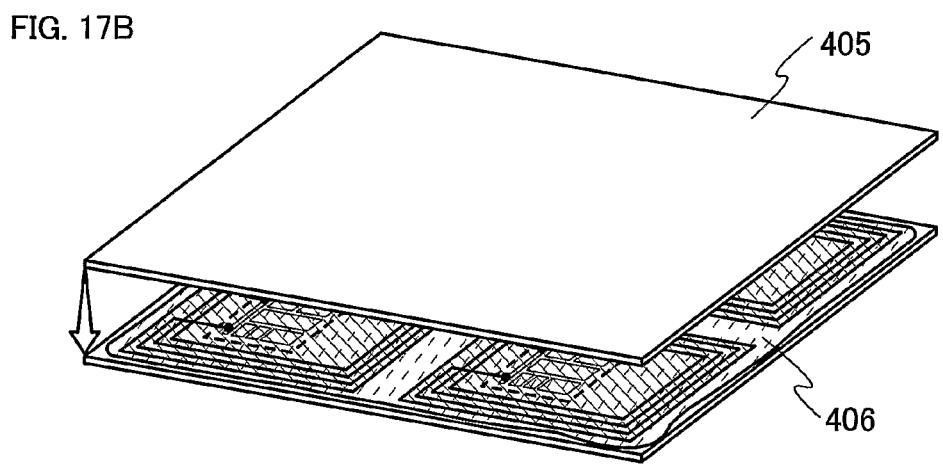
Figure 17C:
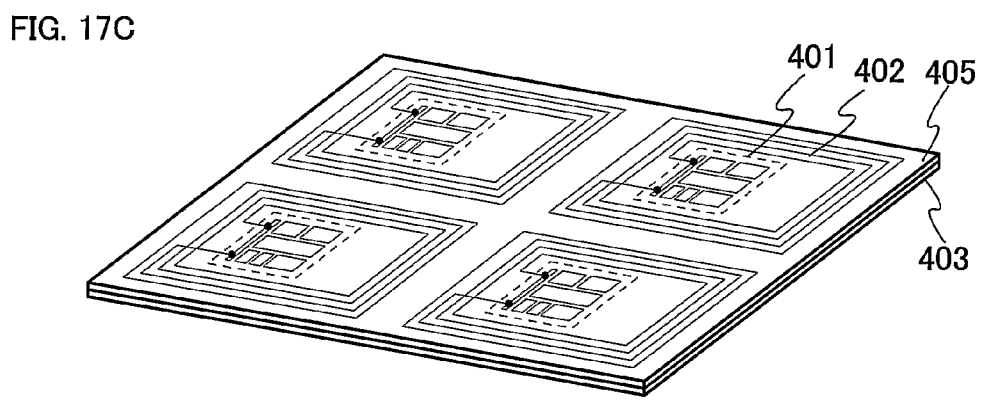

As shown in FIG. 17B, a cover material 405 is attached to the substrate 403 such that the integrated circuits 401 and the antennas 402 are sandwiched therebetween. At this time, an adhesive agent 406 is applied over the substrate 403 so as to cover the integrated circuit 401 and the antenna 402. By attaching the cover material 405 to the substrate 403, the state as shown in FIG. 17C is obtained. Note that, in order to clearly show the positions of the integrated circuit 401 and the antenna 402, FIG. 17C illustrates the integrated circuit 401 and the antenna 402 such that they are seen through the cover material 405.

Figure 17D:
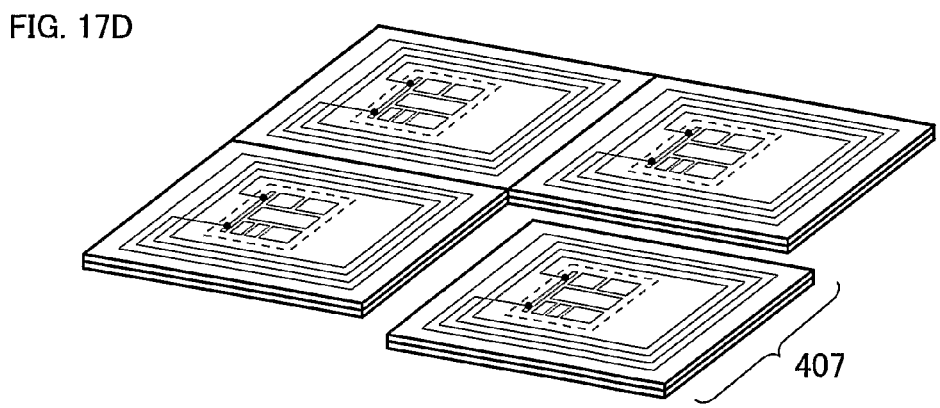

As shown in FIG. 17D, the set of the integrated circuit 401 and the antenna 402 is separated from other sets of the integrated circuits 401 and the antennas 402 by dicing or scribing, thereby completing an ID chip or an IC card 407.

This embodiment shows the example of separating the antennas 402 along with the integrated circuits 401, however, this embodiment is not limited to this configuration. The antenna may be formed over the substrate 403 in advance and the integrated circuit 401 may be attached to the substrate such that the integrated circuit 401 and the antenna 402 are electrically connected to each other. Alternatively, after attaching the integrated circuit 401 to the substrate 403, the antenna may be attached to the substrate such that the antenna is electrically connected to the integrated circuit 401. Alternatively, the antenna may be formed over the cover material 405 in advance and the cover material 405 may be attached onto the substrate 403 such that the integrated circuit 401 can be electrically connected to the antenna.

When the substrate 403 and the cover material 405 are flexible, the ID chip or IC card 407 can be used while being stressed. In the present invention, the use of the stress relaxation film can allow pressure applied to the ID chip or IC card 407 to be alleviated to some extent. In addition, by providing plural barrier films, stress to each barrier film can be suppressed, so that adverse effects to the characteristics of the semiconductor element due to dispersion of the alkali metal, the alkali earth metal or water into the semiconductor element can be prevented.

Note that the ID chip using a glass substrate can be referred to as an IDG chip (identification glass chip) whereas the ID chip using a flexible substrate can be referred to as an IDF chip (identification flexible ship).

This embodiment can be combined freely with Embodiments 1 to 6.

Embodiment 8

Figure 18A:
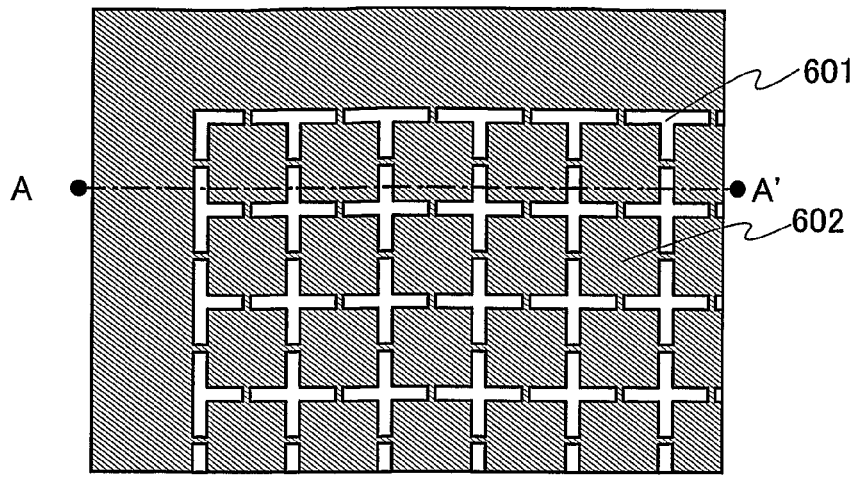
FIGS. 18A to 18D each show a shape of a groove to be formed when a plurality of integrated circuits formed on one substrate are separated.
Figure 18B:
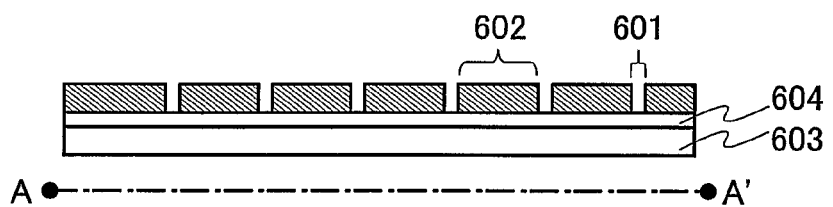

Embodiment 8 describes a shape of a groove to be formed when separating a plurality of integrated circuits formed on one substrate. FIG. 18A is a top view of a substrate 603 over which a groove 601 is formed. FIG. 18B is a cross-sectional view of A-A' from FIG. 18A.

An integrated circuit 602 is formed over a separation layer 604 which is formed on the substrate 603. The groove 601 is formed between integrated circuits 602 and formed deep enough to expose the separation layer 604. In this embodiment, the plurality of integrated circuits 602 are not completely but partially isolated by grooves 601.

Figure 18C:
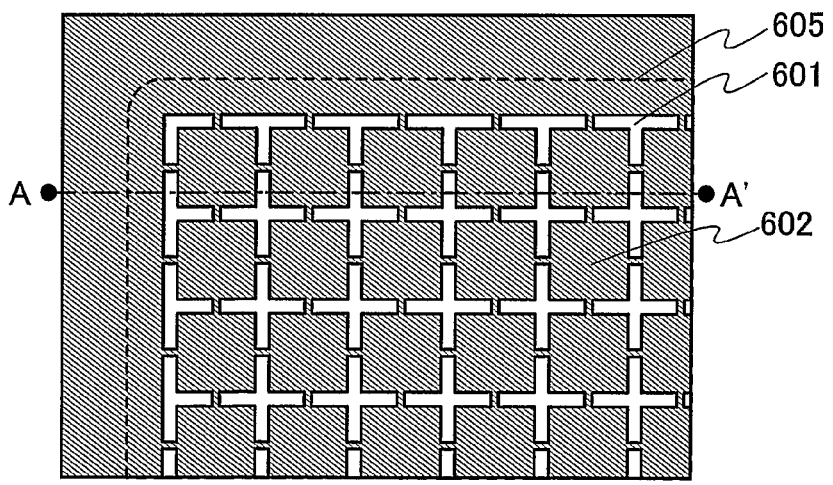
Figure 18D:
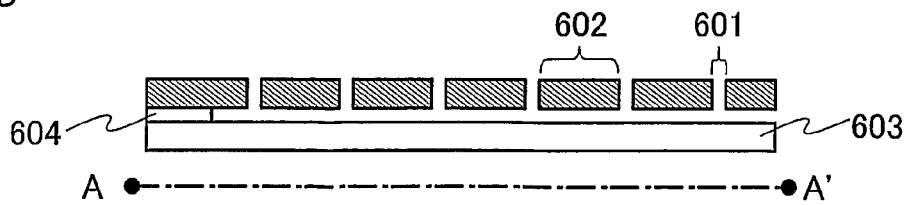

Next, FIGS. 18C and 18D each show a mode where an etching gas is flown into the groove 601 shown in FIGS. 18A and 18B to remove the separation layer 604 by etching. FIG. 18C corresponds to a top view of the substrate 603 on which the groove 601 is formed. FIG. 18D corresponds to a cross-sectional view of A-A' from FIG. 18C. It is assumed that the separation layer 604 is etched from the groove 601 to a region denoted by a broken line 605. The plurality of integrated circuits 602 are not completely but partially isolated by grooves 601 and are partially connected to each other as shown in FIGS. 18C and 18D. Therefore, it is possible to prevent each integrated circuit 602 from moving as the support is lost after etching the separation layer 104.

After the mode shown in FIGS. 18C and 18D is formed, integrated circuits 602 are separated from the substrate 603 by using a tape, a substrate or the like attached with an adhesive agent, which is prepared separately. The plurality of integrated circuits 602 which have been separated from the substrate 603 are attached onto a support medium before or after being sectioned from each other.

This embodiment describes an example of a manufacturing method of an ID chip or an IC card. A manufacturing method of an ID chip or an IC card according to the present invention is not limited to the structure described in this embodiment.

This embodiment can be freely combined with Embodiments 1 to 7.

Embodiment 9

When an ID chip of the present invention is formed using a flexible substrate, the ID chip is suitable for being attached to an object having flexibility or a curved face.

When a memory such as a ROM that cannot be rewritten is formed inside of an integrated circuit included in the ID chip of the present invention, forgery of the objects attached with the ID chip can be prevented. For example, the application of the JD chip of the present invention to foods in which their commodity values largely depend on production areas and producers is advantageous for inhibiting mislabeling of the production areas and producers at a low cost.

Specifically, the ID chip of the present invention can be used as the ID chip attached to tags having information about objects such as luggage tags, price tags and name tags. Also, the ID chip of the present invention itself may be utilized as such tags. For example, the ID chip may be attached to certificates corresponding to documents that prove facts such as family registers, certificates of residence, passports, licenses, identification cards, member cards, surveyor certificates, credit cards, cash cards, prepaid cards, consultation cards and commuter passes. In addition, for instance, the ID chip may be attached to portfolios corresponding to certificates that show property rights in private law such as bills, checks, carriage notes, cargo certificates, warehouse certificates, stock certificates, bond certificates, gift certificates and deeds of mortgage.

Figure 19A:
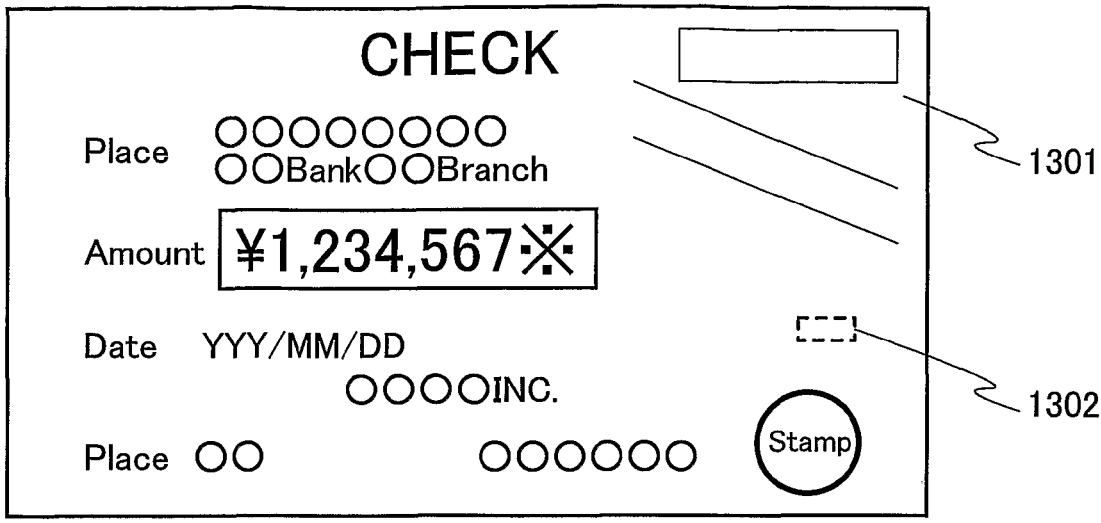
FIGS. 19A to 19C each show how to use an ID chip according to one aspect of the present invention.

FIG. 19A shows an example of a check 1301 attached with an ID chip 1302 of the present invention. Although the ID chip 1302 is attached to the inside of the check 1301 in FIG. 19A, it may be provided to be exposed on the surface of the check.

Figure 19B:
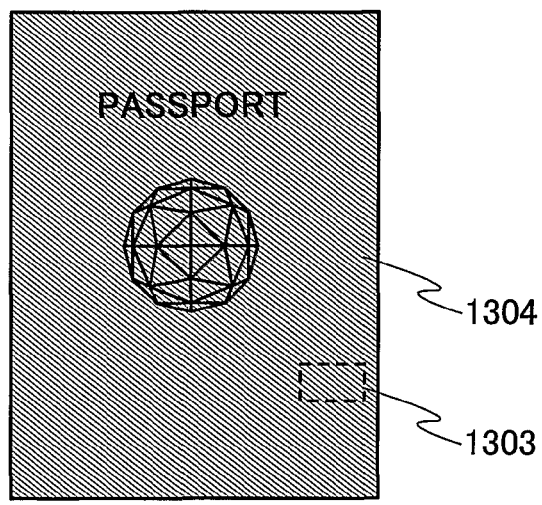

FIG. 19B shows an example of a passport 1304 attached with an ID chip 1303 of the present invention. Although the ID chip 1303 is attached to the front page of the passport 1304 in FIG. 19B, it may be attached to another page of the passport.

Figure 19C:
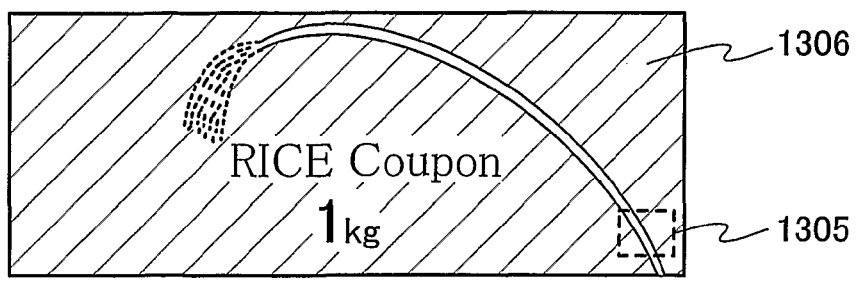

FIG. 19C shows an example of a gift certificate 1306 attached with an ID chip 1305 of the present invention. The ID chip 1305 may be attached to either the inside of the gift certificate 1306 or on the surface thereof to be exposed.

The ID chip using an integrated circuit with TFTs is inexpensive and thin, and hence, the ID chip of the present invention is suitable for ID chips that are eventually discarded by consumers. In particular, when the ID chip is applied to products in which difference in price in units of several yen to several tens of yen significantly affects sales, a packing material having the inexpensive and thin ID chip of the present invention is very advantageous. The packing material is equivalent to a support medium, such as a plastic wrap, a plastic bottle, a tray and a capsule, which can be shaped or has been shaped to wrap up an object.

Figure 20A:
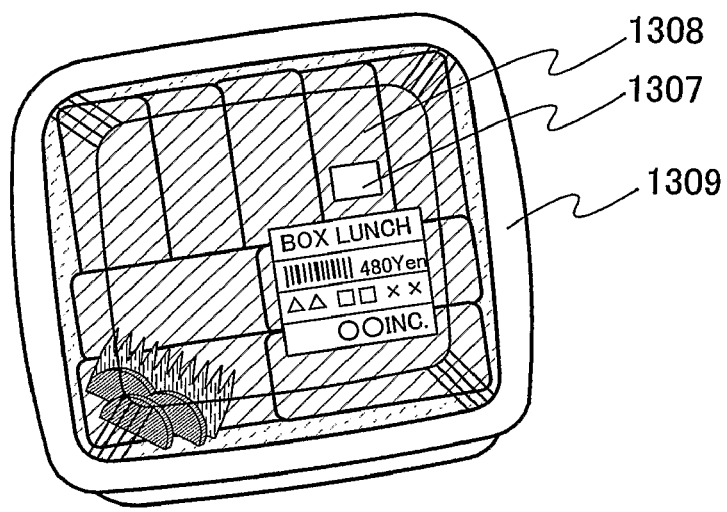
FIGS. 20A and 20B each show how to use an ID chip according to one aspect of the present invention.

A state of packing a boxed meal 1309 for sale by a packing material 1308, which is attached with an ID chip 1307 of the present invention, is shown in FIG. 20A. By storing the price and the like of the product in an ID chip 1307, the cost for the boxed meal 1309 can be accounted for by a register having functions of a reader/writer.

For example, the ID chips of the present invention may be attached to a product label so that the distribution process of the product is managed.

Figure 20B:
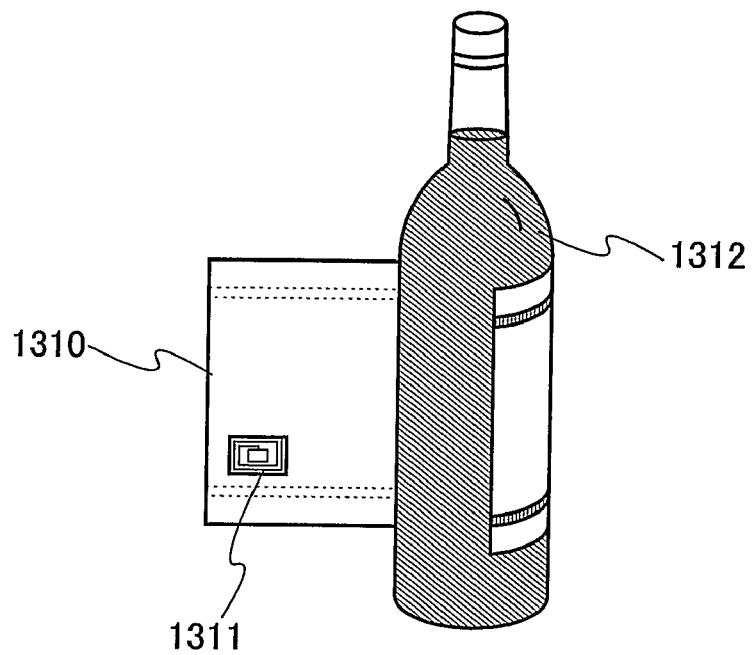

As shown in FIG. 20B, an ID chip 1311 of the present invention is attached to a support medium such as a product label 1310 with its rear face having viscosity. The label 1310 attached with the ID chip 1311 is pasted to a product 1312. Identification information about the product 1312 can be read wirelessly from the ID chip 1311 attached to the label 1310. Accordingly, management of distribution process of the product becomes easier by the ID chip 1311.

In the case of using a nonvolatile memory, which can write information therein, as a memory of an integrated circuit included in the ID chip 1311, information of the distribution process of the product 1312 can be stored. Stored information of the process in the production stage of products can allow wholesalers, retailers and consumers to grasp information about production areas, producers, dates of manufacture, processing methods and the like easily.

This embodiment can be freely combined with Embodiments 1 to 8.

EXPLANATION OF REFERENCE

100: integrated circuit, 101: light-receiving element, 102: light-emitting element, 103: antenna, 104: substrate, 105: cover material, 110 rectification circuit, 111 power supply circuit, 112: demodulation circuit, 113: logic circuit, 114: memory, 115: memory control circuit, 116: amplifier, 117: amplifier, 201: card body, 202: pixel portion, 203: light-receiving element, 204: light-emitting element, 205: substrate, 206: integrated circuit, 207: display device, 208: antenna, 210: rectification circuit, 211: power supply circuit, 212: demodulation circuit, 213: logic circuit, 214: memory, 215: memory control circuit, 216: amplifier, 217: amplifier, 218: control circuit, 219: signal line driver circuit, 220: scanning line driver circuit, 301: battery, 303: solar battery, 401: integrated circuit, 402: antenna, 403: substrate, 404: adhesive agent, 405: cover material, 406: adhesive agent, 407: IC card, 500: substrate, 501: separation layer, 502: base film, 503: semiconductor film, 504: semiconductor film, 505: semiconductor film, 508: gate insulating film, 509: gate electrode, 510: gate electrode, 513: resist, 514: resist, 515: low concentration impurity region, 518: resist, 519: high concentration impurity region, 520: insulating film, 521: sidewall, 525: resist, 526: high concentration impurity region, 527: high concentration impurity region, 528: high concentration impurity region, 529: n-channel TFT, 530: p-channel TFT, 531: n-channel TFT, 532: n-channel TFT, 533: interlayer insulating film, 534: interlayer insulating film, 535: wiring, 536: wiring, 538: wiring, 540: wiring, 541: wiring, 542: protective layer, 543: groove, 544: adhesive agent, 545: substrate, 546: bank, 547: electroluminescent layer, 548: electrode, 549: light-emitting element, 550: antenna, 551: adhesive agent, 552: cover material, 601: groove, 602: integrated circuit, 603: substrate, 604: separation layer, 605: broken line, 701:

n-channel TFT, 702: p-channel TFT, 703: impurity region, 704: channel formation region, 705: semiconductor film, 706: gate insulating film, 707: gate electrode, 707a: conductive film, 708: sidewall, 709: sidewall, 710: LDD (Lightly Doped Drain) region, 711: semiconductor film, 712: impurity region, 713: channel formation region, 721: n-channel TFT, 722: p-channel TFT, 728: sidewall, 741: n-channel TFT, 742: p-channel TFT, 743: impurity region, 744: channel formation region, 745: semiconductor film, 746: gate insulating film, 747: gate electrode, 748: protective film, 750: LDD (Lightly Doped Drain) region, 751: semiconductor film, 752: impurity region, 753: channel formation region, 1200: bank, 1201: wiring, 1202: wiring, 1203: terminal, 1204: electroluminescent layer, 1205: electrode, 1206: light-emitting element, 1207: adhesive agent, 1208: cover material, 1209: antenna, 1210: substrate, 1211: semiconductor element, 1215: base film, 1301: check, 1302: ID chip, 1303: ID chip, 1304: passport, 1305: ID chip, 1306: gift certificate, 1307: ID chip, 1308: packing material, 1309: boxed meal, 1310: label, 1311: ID chip, 1312: product, 1401: TFT, 1402: semiconductor film, 1403: gate insulating film, 1404: gate electrode, 1405: interlayer insulating film, 1406: interlayer insulating film, 1407: wiring, 1408: antenna, 1409: light-emitting element, 1411: TFT, 1412: semiconductor film, 1413: gate insulating film, 1414: gate electrode, 1418: antenna, 1419: light-emitting element, 1500: photodiode, 1501: interlayer insulating film, 1502: TFT, 1503: interlayer insulating film, 1504: cathode, 1505: photoelectric conversion layer, 1506: anode, 1510: substrate, 1511: photodiode, 1512: light-emitting element, 1513: shielding film, 6001: TFT, 6002: interlayer insulating film, 6003: light-emitting element, 6004: electrode, 6005: electroluminescent layer, 6006: electrode, 6007: interlayer insulating film, 6008: bank, 6009: wiring, 6011: TFT, 6013: light-emitting element, 6014: electrode, 6015: electroluminescent layer, 6016: electrode, 6021: TFT, 6023: light-emitting element, 6024: electrode, 6025: electroluminescent layer, 6026: electrode, 6029: wiring, 6031: TFT, 6033: light-emitting element, 6034: electrode, 6035: electroluminescent layer, 6036: electrode, 6039: wiring, 6041: TFT, 6043: light-emitting element, 6044: electrode, 6045: electroluminescent layer, 6046: electrode, 6051: TFT, 6053: light-emitting element, 6054: electrode, 6055: electroluminescent layer, 6056: electrode, 6059: wiring

The invention claimed is:

1. A semiconductor device comprising:
an antenna;
an integrated circuit comprising a thin film transistor;
a light-receiving element configured to receive a signal by optical communication; and
a light-emitting element configured to transmit a signal by optical communication,
wherein the light-receiving element has a layer for conducting photoelectric conversion using a non-single crystal thin film,
wherein the light-emitting element has an electroluminescent layer using a non-single crystal thin film,
wherein the integrated circuit includes a power supply circuit configured to generate a power supply voltage from an alternating voltage generated by the antenna, and
wherein the antenna, the light-emitting element and the light-receiving element are electrically connected to the integrated circuit on the same substrate.

2. A semiconductor device comprising:
an antenna;
an integrated circuit comprising a thin film transistor;
a light-receiving element configured to receive a signal by optical communication; and
a light-emitting element configured to transmit a signal by optical communication,
wherein the antenna, the light-emitting element and the light-receiving element are electrically connected to the integrated circuit,
wherein the integrated circuit includes a power supply circuit configured to generate a power supply voltage from an alternating voltage generated by the antenna, and
wherein the integrated circuit, the light-emitting element and the light-receiving element are formed on the same substrate.

3. A semiconductor device comprising:
an antenna;
an integrated circuit comprising a thin film transistor;
a light-receiving element configured to receive a signal by optical communication; and
a light-emitting element configured to transmit a signal by optical communication,
wherein the antenna, the light-emitting element and the light-receiving element are electrically connected to the integrated circuit,
wherein the integrated circuit includes a power supply circuit configured to generate a power supply voltage from an alternating voltage generated by the antenna, and
wherein the antenna, the integrated circuit, the light-emitting element and the light-receiving element are formed on the same substrate.

4. A semiconductor device comprising:
an integrated circuit;
a light-receiving element configured to receive a signal by optical communication; and
a light-emitting element configured to transmit a signal by optical communication,
wherein the integrated circuit comprises a connection terminal, a rectification circuit configured to rectify an alternating voltage generated by an antenna, a power supply circuit configured to generate a power supply voltage by using a voltage outputted from the rectification circuit, a demodulation circuit, and a logic circuit, and
wherein the integrated circuit, the light-emitting element and the light-receiving element are formed on the same substrate.

5. A semiconductor device comprising:
an antenna;
an integrated circuit comprising a thin film transistor;
a light-receiving element configured to receive a signal by optical communication; and
a light-emitting element configured to transmit a signal by optical communication,
wherein the light-receiving element has a layer for conducting photoelectric conversion using a non-single crystal thin film,
wherein the light-emitting element has an electroluminescent layer using a non-single crystal thin film,
wherein the antenna, the light-emitting element and the light-receiving element are electrically connected to the integrated circuit,
wherein the integrated circuit, the light-emitting element and the light-receiving element are attached to a substrate with an adhesive agent, and wherein the integrated circuit includes a power supply circuit configured to generate a power supply voltage from an alternating voltage generated by the antenna.

6. A semiconductor device comprising:
an antenna;
an integrated circuit comprising a thin film transistor;
a light-receiving element configured to receive a signal by optical communication; and
a light-emitting element configured to transmit a signal by optical communication,
wherein the antenna, the light-emitting element and the light-receiving element are electrically connected to the integrated circuit,
wherein the integrated circuit, the light-emitting element and the light-receiving element are attached to a substrate with an adhesive agent, and
wherein the integrated circuit includes a power supply circuit configured to generate a power supply voltage from an alternating voltage generated by the antenna.

7. A semiconductor device comprising:
an antenna;
an integrated circuit comprising a thin film transistor;
a light-receiving element configured to receive a signal by optical communication; and
a light-emitting element configured to transmit a signal by optical communication,
wherein the antenna, the light-emitting element and the light-receiving element are electrically connected to the integrated circuit,
wherein the antenna, the integrated circuit, the light-emitting element and the light-receiving element are attached to a substrate with an adhesive agent, and
wherein the integrated circuit includes a power supply circuit configured to generate a power supply voltage from an alternating voltage generated by the antenna.

8. A semiconductor device comprising:
an integrated circuit;
a light-receiving element configured to receive a signal by optical communication; and
a light-emitting element configured to transmit a signal by optical communication,
wherein the integrated circuit comprises a connection terminal, a rectification circuit configured to rectify an alternating voltage generated by an antenna, a power supply circuit configured to generate a power supply voltage by using a voltage outputted from the rectification circuit, a demodulation circuit, and a logic circuit,
wherein the integrated circuit, the light-emitting element and the light-receiving element are formed integrally, and
wherein the integrated circuit, the light-emitting element and the light-receiving element are attached to a substrate with an adhesive agent.

9. The semiconductor device according to any one of claims 5 to 8, wherein the substrate is a plastic substrate.

10. An IC card comprising:
an antenna;
an integrated circuit comprising a thin film transistor;
a light-receiving element configured to receive a signal by optical communication; and
a light-emitting element configured to transmit a signal by optical communication,
wherein the antenna, the light-emitting element and the light-receiving element are electrically connected to the integrated circuit,
wherein the integrated circuit includes a power supply circuit configured to generate a power supply voltage from an alternating voltage generated by the antenna, and
wherein the integrated circuit, the light-emitting element and the light-receiving element are formed on the same substrate.

11. The IC card according to claim 10, wherein the antenna, the integrated circuit, the light-emitting element and the light-receiving element are formed on the same substrate.

12. An IC card comprising:
an integrated circuit;
a light-receiving element configured to receive a signal by optical communication; and
a light-emitting element configured to transmit a signal by optical communication,
wherein the integrated circuit comprises a connection terminal, a rectification circuit configured to rectify an alternating voltage generated by an antenna, a power supply circuit configured to generate a power supply voltage by using a voltage outputted from the rectification circuit, a demodulation circuit, and a logic circuit, and
wherein the integrated circuit, the light-emitting element and the light-receiving element are formed on the same substrate.

13. An IC card comprising:
an antenna;
an integrated circuit comprising a thin film transistor;
a light-receiving element configured to receive a signal by optical communication; and
a light-emitting element configured to transmit a signal by optical communication,
wherein the antenna, the light-emitting element and the light-receiving element are electrically connected to the integrated circuit,
wherein the integrated circuit, the light-emitting element and the light-receiving element are attached to a substrate with an adhesive agent,
wherein the integrated circuit includes a power supply circuit configured to generate a power supply voltage from an alternating voltage generated by the antenna.

14. The IC card according to claim 13, wherein the antenna and the integrated circuit in addition to the light-emitting element and the light-receiving element are attached to the substrate with an adhesive agent.

15. The IC card according to claim 12, wherein the integrated circuit, the light-emitting element and the light-receiving element are attached to a substrate with an adhesive agent.

16. The IC card according to any one of claims 12-13, wherein the substrate is a plastic substrate.

* * * * *

UNITED STATES PATENT AND TRADEMARK OFFICE
CERTIFICATE OF CORRECTION

PATENT NO.       : 8,030,745 B2                                Page 1 of 1
APPLICATION NO.  : 10/590271
DATED            : October 4, 2011
INVENTOR(S)      : Shunpei Yamazaki It is certified that error appears in the above-identified patent and that said Letters Patent is hereby corrected as shown below:

At column 3, line 66, "ED" should be --ID--;

At column 12, line 64, "529 to 532" should be --TFTs 529 to 532--;

At column 12, line 66, "TFT" should be --TFTs--;

At column 13, line 9, "TFT" should be --TFTs--;

At column 13, line 10, "TFT" should be --TFTs--;

At column 14, line 31, "VL-WSKL10" should be --VL-WSHL10--;

At column 26, line 50, "chows" should be --shows--;

At column 27, line 67, "more are" should be --more TFTs are--;

At column 31, line 29, "JD" should be --ID--.

Signed and Sealed this

Seventeenth Day of January, 2012

David J. Kappos
*Director of the United States Patent and Trademark Office*